(12) United States Patent
Lee et al.

(10) Patent No.: US 8,361,274 B2
(45) Date of Patent: Jan. 29, 2013

(54) ETCHING APPARATUS AND ETCHING METHOD

(75) Inventors: Kwang-Myung Lee, Suwon (KR); Ki-Young Yun, Suwon (KR); Il-Kyoung Kim, Suwon (KR); Sung-Wook Park, Suwon (KR); Seung-Ki Chae, Suwon (KR); No-Hyun Huh, Suwon (KR); Jae-Wook Kim, Suwon (KR); Jae-Hyuck An, Suwon (KR); Woo-Seok Kim, Suwon (KR); Myeong-Jin Kim, Suwon (KR); Kyoung-Ho Jang, Suwon (KR); Shinji Yanagisawa, Towada (JP); Kengo Tsutsumi, Susono (JP); Seiichi Takahashi, Ishioka (JP)

(73) Assignees: Samsung Electronics Co., Ltd, Suwon (KR); Ulvac, Inc., Chigasaki-Shi (JP)

( * ) Notice: Subject to any disclaimer, the term of this patent is extended or adjusted under 35 U.S.C. 154(b) by 0 days.

(21) Appl. No.: 11/032,651

(22) Filed: Jan. 10, 2005

(65) Prior Publication Data

US 2005/0150861 A1    Jul. 14, 2005

(30) Foreign Application Priority Data

Jan. 13, 2004  (JP) ............................... P 2004-005212
Jan. 13, 2004  (JP) ............................... P 2004-005213
Jan. 13, 2004  (JP) ............................... P 2004-005218
Jan. 13, 2004  (JP) ............................... P 2004-005220

(51) Int. Cl.
*H01L 21/3065*  (2006.01)
*C23C 16/455*  (2006.01)
*C23C 16/00*  (2006.01)

(52) U.S. Cl. ......... 156/345.33; 156/345.29; 156/345.35; 156/345.36; 118/715; 118/724; 118/723 ME; 118/723 ER; 118/723 IR

(58) Field of Classification Search .................. 118/715, 118/724, 723 ME, 723 ER, 723 IR; 156/345.29, 156/345.33, 345.35, 345.36
See application file for complete search history.

(56) References Cited

U.S. PATENT DOCUMENTS

| | | | | |
|---|---|---|---|---|
| 5,015,330 A | * | 5/1991 | Okumura et al. | 438/694 |
| 5,618,349 A | * | 4/1997 | Yuuki | 118/715 |
| 5,643,394 A | * | 7/1997 | Maydan et al. | 156/345.33 |

(Continued)

FOREIGN PATENT DOCUMENTS

| | | | |
|---|---|---|---|
| JP | 62263629 A | * | 11/1987 |
| JP | 63-102225 | * | 5/1988 |

(Continued)

*Primary Examiner* — Jeffrie R Lund
(74) *Attorney, Agent, or Firm* — Grossman, Tucker, Perreault & Pfleger, PLLC

(57) ABSTRACT

A vacuum processing apparatus is provided with: a vacuum processing tank; a first gas introduction section that is constructed such that a first processing gas in a radical state is introduced into the vacuum processing tank and is guided to a semiconductor wafer; and a second gas introduction section that is constructed such that a second processing gas that reacts with the first processing gas is introduced into the vacuum processing tank and is guided to the semiconductor wafer. The second gas introduction section has two shower nozzles provided at positions on either side of an introduction pipe provided for the first gas introduction section. According to this vacuum processing apparatus, high speed processing of a number of processing objects can be achieved. Moreover, the in-plane uniformity of the processing objects after processing can be ensured.

12 Claims, 16 Drawing Sheets

U.S. PATENT DOCUMENTS

| | | | |
|---|---|---|---|
| 5,903,711 A * | 5/1999 | Okase | 392/418 |
| 6,040,010 A * | 3/2000 | Srinivasan et al. | 427/250 |
| 6,132,514 A * | 10/2000 | Srinivasan et al. | 118/715 |
| 6,143,078 A * | 11/2000 | Ishikawa et al. | 118/715 |
| 6,178,918 B1 * | 1/2001 | van Os et al. | 118/723 R |
| 6,444,262 B1 * | 9/2002 | Kitamura et al. | 427/248.1 |
| 6,511,539 B1 * | 1/2003 | Raaijmakers | 117/102 |
| 6,866,889 B1 * | 3/2005 | Lill et al. | 427/248.1 |
| 7,094,312 B2 * | 8/2006 | Libby et al. | 156/345.39 |
| 7,094,708 B2 * | 8/2006 | Kato et al. | 438/778 |
| 7,422,635 B2 * | 9/2008 | Zheng et al. | 118/715 |
| 7,861,668 B2 * | 1/2011 | Toyoda et al. | 118/723 E |
| 7,900,580 B2 * | 3/2011 | Kontani et al. | 118/723 E |
| 8,020,514 B2 * | 9/2011 | Toyoda et al. | 118/723 E |
| 8,028,652 B2 * | 10/2011 | Toyoda et al. | 118/723 E |
| 8,047,158 B2 * | 11/2011 | Kontani et al. | 118/723 E |
| 8,193,101 B2 * | 6/2012 | Sato et al. | 438/765 |
| 8,261,692 B2 * | 9/2012 | Kontani et al. | 118/723 E |
| 2001/0010257 A1 * | 8/2001 | Ni et al. | 156/345 |
| 2001/0050054 A1 * | 12/2001 | Kwag et al. | 118/715 |
| 2002/0036066 A1 * | 3/2002 | Ogawa et al. | 156/345 |
| 2004/0025786 A1 * | 2/2004 | Kontani et al. | 118/715 |
| 2004/0149216 A1 * | 8/2004 | Osada et al. | 118/723 E |
| 2005/0045102 A1 * | 3/2005 | Zheng et al. | 118/722 |
| 2005/0150861 A1 * | 7/2005 | Lee et al. | 216/2 |
| 2005/0153553 A1 * | 7/2005 | Lee et al. | 438/689 |
| 2005/0211167 A1 * | 9/2005 | Gunji et al. | 118/715 |
| 2006/0084201 A1 * | 4/2006 | Hasper et al. | 438/108 |
| 2006/0096539 A1 * | 5/2006 | Kawasaki et al. | 118/723 R |
| 2006/0110533 A1 * | 5/2006 | Hwang et al. | 427/248.1 |
| 2006/0110534 A1 * | 5/2006 | Hwang et al. | 427/248.1 |
| 2006/0175304 A1 * | 8/2006 | Hwang et al. | 219/121.43 |
| 2006/0198955 A1 * | 9/2006 | Zheng et al. | 427/248.1 |
| 2007/0137794 A1 * | 6/2007 | Qiu et al. | 156/345.33 |
| 2007/0246355 A1 * | 10/2007 | Toyoda et al. | 204/298.02 |
| 2008/0060580 A1 * | 3/2008 | Toyoda et al. | 118/725 |
| 2008/0066681 A1 * | 3/2008 | Toyoda et al. | 118/723 R |
| 2008/0093215 A1 * | 4/2008 | Toyoda et al. | 204/298.02 |
| 2008/0121180 A1 * | 5/2008 | Kontani et al. | 118/723 R |
| 2008/0132084 A1 * | 6/2008 | Miya et al. | 438/785 |
| 2008/0251014 A1 * | 10/2008 | Kontani et al. | 118/715 |
| 2008/0251015 A1 * | 10/2008 | Kontani et al. | 118/715 |
| 2009/0044910 A1 * | 2/2009 | Osada et al. | 156/345.43 |
| 2009/0133630 A1 * | 5/2009 | Toyoda et al. | 118/723 ER |
| 2009/0159440 A1 * | 6/2009 | Toyoda et al. | 204/298.07 |
| 2009/0176017 A1 * | 7/2009 | Sakai et al. | 427/255.28 |
| 2010/0015811 A1 * | 1/2010 | Sato et al. | 438/758 |
| 2010/0041238 A1 * | 2/2010 | Cooperberg et al. | 438/710 |
| 2010/0263593 A1 * | 10/2010 | Kontani et al. | 118/723 HC |
| 2011/0176967 A1 * | 7/2011 | Okuda et al. | 422/129 |
| 2012/0156887 A1 * | 6/2012 | Ono et al. | 438/706 |

FOREIGN PATENT DOCUMENTS

| | | | |
|---|---|---|---|
| JP | 01-081311 A | * | 3/1989 |
| JP | 64-081214 | * | 3/1989 |
| JP | 64-081216 | * | 3/1989 |
| JP | 01-109714 | * | 4/1989 |
| JP | 01253229 A | * | 10/1989 |
| JP | 10-335316 | | 12/1998 |
| JP | 2001-284307 | | 10/2001 |
| JP | 2003-124172 | | 4/2003 |
| WO | WO 03104524 A1 | * | 12/2003 |

* cited by examiner

ETCHING APPARATUS AND ETCHING METHOD

BACKGROUND OF THE INVENTION

1. Field of the Invention

The present invention relates to an etching technique, and particularly relates to an etching technique that employs radicals. Specifically, the present invention relates to an etching apparatus that performs etching processing of a natural oxide film formed for example on the surface of a semiconductor wafer in a vacuum, and to a dry etching method.

Priority is claimed on Japanese Patent Applications Nos. 2004-5212, 2004-5213, 2004-5218, and 2004-5220 filed on Jan. 13, 2004, the contents of which are incorporated herein by reference.

2. Description of Related Art

In the process of manufacturing a semiconductor device, it is necessary to remove a natural oxide film formed for example, on the substrate surface of a contact hole bottom part of a semiconductor wafer.

Conventionally, wet etching that uses HF is performed in order to remove the oxide film on the semiconductor surface. However, a dry etching method that uses radicals is recently drawing attention as a technique for removing in particular a natural oxide film on the semiconductor surface (for example, see Japanese Unexamined Patent Application, First Publication No. Hei. 10-335316).

In this etching method, reactive gas and radicals are introduced into the vacuum atmosphere of a reaction chamber and reacted with the natural oxide film on the substrate surface, and a reaction product is thermally decomposed, and the gas produced is removed by evacuation.

For example, when an etching object formed of a silicon oxide film formed on a surface of a silicon substrate is etched with a dry etching method, the substrate is first disposed in a reaction chamber, and after a vacuum atmosphere is formed in the reaction chamber, an intermediate product that reacts with the etching object is produced in the reaction chamber.

For example, when radicals of hydrogen gas and a reactive gas such as fluorine gas are supplied to the reaction chamber, the reactive gas is reduced, and an intermediate product such as $NH_xF_y$ (x and y are optional integers) is produced.

The intermediate product reacts with the etching object on the surface of the substrate, and a reaction product is produced. Then as heat is applied to the substrate, the reaction product is thermally decomposed, and becomes a pyrolysis gas such as $NH_3$ gas, HF gas and $SiF_4$ gas and vaporizes. As a result, the etching object is removed from the substrate surface.

According to the dry etching method, the silicon oxide film can be removed by etching in the vacuum atmosphere, and hence the silicon substrate is not contaminated by moisture and oxygen in the air.

A reaction like this is sometimes performed by sheet processing or by batch processing in which a number of substrates are carried into the reaction chamber and are subjected to etching processing at the same time (see Japanese Unexamined Patent Application, First Publication Nos. 2001-284307 and 2003-124172).

However, there is a problem in a conventional technique like this in that it is difficult to ensure the in-plane uniformity after processing.

Particularly, when a number of semiconductor wafers are processed at the same time, there is a problem in that the in-plane uniformity varies according to the position of the semiconductor wafer in the vacuum processing tank. Specifically, there is a problem in that the reaction rate varies among a number of substrates disposed in the reaction chamber depending on their positions relative to the radical introduction port and to the gas introduction port, and the etching amount around the periphery and the center of the substrate varies on a single substrate Moreover, in the conventional dry etching method, particles sometimes adhere to the inner wall of the reaction chamber in the etching process. The device thus needs to be stopped and the particles that adhere to the inner wall of the reaction chamber regularly removed, and the removal operation is complex.

The present invention has been created in order to solve the above mentioned problems of the conventional technique, and its first object is to provide an etching apparatus that allows fast reaction rate and high speed processing of a number of etching objects, and that can improve the in-plane uniformity of the processing object after processing. A second object is to provide a technique that prevents the occurrence of particles and that can remove particles without stopping the apparatus.

SUMMARY OF THE INVENTION

A first aspect of the present invention for achieving the above objects is an etching apparatus comprising: a vacuum processing tank; a first processing gas introduction section that is constructed such that a first processing gas in a radical state is introduced into the vacuum processing tank and is guided to a processing object; and a second processing gas introduction section that is constructed such that a second processing gas that reacts with the first processing gas is introduced into the vacuum processing tank and is guided to the processing object; and the second processing gas introduction section has a plurality of second nozzle sections provided at positions on either side of a first nozzle section provided on the first gas introduction section.

A second aspect of the present invention is that in the first aspect, the second nozzle sections are provided at positions that are symmetric with the gas introduction direction of the first nozzle section.

A third aspect of the present invention is that in the first or the second aspect, the second processing gas introduction section has two second nozzle sections provided at positions on either side of the first nozzle section of the first gas introduction section.

A fourth aspect of the present invention is that in any one of the first through the third aspects, the first and the second gas introduction sections are constructed such that the processing gas is guided to a center part of the processing object.

A fifth aspect of the present invention is that the first and the second nozzle sections of the first and the second gas introduction sections have a plurality of introduction ports for introducing the processing gas to in between a plurality of processing objects disposed at predetermined intervals.

In the case of the above aspects, the second processing gas introduction section has a plurality (for example, two) of the second nozzle sections provided at positions on either side of the first nozzle provided on the first gas introduction section. Therefore, the second processing gas becomes for example a gas curtain of the first processing gas introduced from the first gas introduction section, and as a result, the second processing gas can be streamed symmetrically to the flow of the first processing gas, so that the comparatively short-lived first processing gas can be efficiently guided onto the processing object. Also as a result, the in-plane uniformity after processing can be improved since the reactive intermediate product is generated uniformly on the surface of the processing object.

Moreover, according to the above aspects, the processing speed can be improved since the short-lived gas can be efficiently introduced.

According to the above aspects, the symmetry of the second processing gas to the first processing gas flow can be improved when the second nozzle sections are provided at positions that are symmetric with the gas introduction direction of the first nozzle section. As a result, the in-plane uniformity after processing can be further improved.

Moreover, if the first and the second gas introduction sections are constructed to guide the processing gas to the center part of the processing object, a reaction intermediate product is produced more uniformly on the surface of the processing object, and the in-plane uniformity after processing can be further improved.

Furthermore, if the nozzle sections of the first and the second gas introduction sections have a plurality of introduction ports to introduce the processing gas to in between a plurality of processing objects disposed at predetermined intervals, the in-plane uniformity after processing for a plurality of (many) processing objects can be improved while uniformity among the plurality of processing objects can also be improved, so that a number of processing objects can be uniformly processed in a short period of time.

A sixth aspect of the present invention is an etching apparatus comprising: a first processing gas introduction section that is constructed such that a first processing gas in a radical state is introduced into a vacuum processing tank and is guided to a processing object, and a second processing gas introduction section that is constructed such that a second processing gas that reacts with the first processing gas is introduced into the vacuum processing tank and is guided to the processing object, and the first processing gas introduction section and the second processing gas introduction section have nozzle sections constructed such that the processing gas is guided to a center part of the processing object.

A seventh aspect of the present invention is that in the sixth aspect, the construction is such that the processing object rotates inside the vacuum processing tank, and the first processing gas introduction section and the second processing gas introduction section have nozzle sections constructed such that the processing gas passes through the central axis of the rotation of the processing object.

An eighth aspect of the present invention is that the second processing gas introduction section has two nozzle sections provided at positions on either side of the nozzle section of the first gas introduction section.

A ninth aspect of the present invention is that in the eighth aspect, the second nozzle sections are provided at positions that are symmetric with the gas introduction direction of the first nozzle.

A tenth aspect of the present invention is that in the sixth to through ninth aspects, the nozzle sections of the first and second gas introduction sections have a plurality of introduction ports for introducing the processing gas to in between a plurality of processing objects disposed at predetermined intervals.

According to the above aspects, since the first processing gas introduction section and the second processing gas introduction section have nozzle sections constructed such that the processing gas is guided to the center part of the processing object, the first processing gas reacts with the second processing gas in the center part of the processing object, and reaction intermediate product is produced uniformly towards the outer peripheral edge of the surface of the processing object. As a result, the in-plane uniformity after processing can be improved.

In the above aspects, the construction is such that the processing object rotates in the vacuum processing tank, and if the first processing gas introduction section and the second processing gas introduction section have nozzle sections constructed such that the processing gas passes through the central axis of rotation of the processing object, the reaction intermediate product can be produced uniformly towards the outer peripheral edge of the processing object surface. As a result, the in-plane uniformity after processing can be further improved.

Moreover, according to the above aspects, if the second processing gas introduction section has two nozzle sections provided at positions on either side of the nozzle section of the first gas introduction section, particularly if the second nozzle sections are provided at positions that are symmetric with the gas introduction direction of the first nozzle, the first and the second processing gases can be symmetrically guided to the center part of the processing object. As a result, the uniformity of the reaction intermediate product can be enhanced, and the in-plane uniformity after processing can be further improved.

Furthermore, if the nozzle sections of the first and the second gas introduction sections have a plurality of introduction ports to introduce the processing gas to in between a plurality of processing objects disposed at predetermined intervals, the in-plane uniformity after processing for a plurality of processing objects can be improved, so that a number of processing objects can be processed in a short period of time.

An eleventh aspect of the present invention is an etching method comprising; arranging the periphery of a circular shaped substrate inside a reaction space that is surrounded by a wall face of a reaction chamber and that is substantially circular shaped in cross section, so as to oppose the wall face, then introducing a reactive gas and radicals into the reaction space and reacting with an etching object on the substrate surface, and then increasing the temperature of the substrate and thermally decomposing the reaction product, and removing the etching object; wherein the periphery of the substrate and the wall face do not come in contact, and a distance between the periphery of the substrate and the wall face is no greater than 25 mm, and the substrate is rotated when the reactive gas and the radicals are introduced.

A twelfth aspect of the present invention is that in the eleventh aspect, a plurality of the substrates are disposed in parallel at predetermined intervals in the reaction space.

A thirteenth aspect of the present invention is that in the twelfth aspect, a center of the each substrate is disposed on a central axis of the reaction space.

A fourteenth aspect of the present invention is that in either one of the eleventh to the thirteenth aspects, a gas having fluorine in its chemical structure is used as the reactive gas, and a gas that produces hydrogen radicals is used as the active gas, and the etching object is a silicon oxide.

A fifteenth aspect of the present invention is that in the fourteenth aspect, at least one of $NH_3$ gas and $N_2$ gas is used as the active gas.

A sixteenth aspect of the present invention is that in the fifteenth aspect, $NF_3$ gas is used as the reactive gas, and $N_2$ gas is added to the active gas.

In the above aspects, a plurality of circular shaped substrates are carried into the reaction space, and each substrate is distanced from each other and disposed perpendicular to the central axis of the reaction space, so that the periphery of the substrates oppose the wall face.

Moreover, in the etching method of the above aspects, the radicals are produced from the active gas, and the reactive gas and the radicals are introduced into the reaction space described above and are reacted with the etching object formed on the surface of each substrate. Then after a thermally decomposable reaction product is produced, the temperature of each substrate is increased, and the reaction product is thermally decomposed, and the decomposed product is evacuated, so that the etching object is removed. The reactive gas and radicals may be introduced together, or the reactive gas may be introduced first and then the radicals may be introduced along with the reactive gas.

Furthermore, according to the above aspects, since in order to rotate the substrate, the periphery of each substrate and the wall face do not come in contact, and the distance between each substrate and the wall face is no greater than 25 mm, the introduced reactive gas and radicals are prevented from flowing between the substrate and the wall face unnecessarily. As a result, the flow of the introduced reactive gas and radicals passes through the center of the substrate, and is exhausted from the reaction space by evacuation.

Also, when introducing the reactive gas or when introducing the reactive gas and radicals, since the substrate is rotating, the entire surface of the substrate comes in contact with the reactive gas or radicals.

Moreover, the radicals and reactive gas react with the etching object on the substrate surface, and the reaction product is gasified by thermal decomposition and removed by evacuation.

If the etching object is a silicon natural oxide film (silicon oxide thin film), then when a gas having fluorine in its chemical structure is used as the reactive gas, and hydrogen radicals are used as the radicals, the reaction progresses at ambient temperature even without heat application, and a reaction product is produced. This reaction product is not a gas, however it thermally decomposes when heated and produces gas, which is removed.

According to the above aspects, since the reactive gas and radicals flow between the substrates and do not flow between the substrate and wall face unnecessarily, uniform etching with a high reaction rate can be performed.

A seventeenth aspect of the present invention is an etching method comprising, introducing radicals and reactive gas into a vacuum tank in which a plurality of substrates formed with an etching object on their surfaces are vertically disposed at constant intervals to each other, and having; a reaction step for reacting the radicals and the reactive gas and the etching object to produce a reaction product; a gas removal step for stopping introduction of the radicals and the reactive gas, and lowering the pressure in the vacuum tank; and a heating step for applying heat to the substrates, and decomposing the reaction product and producing pyrolysis gas, and removing the pyrolysis gas; wherein the heating step is performed while a purge gas is being introduced into the vacuum tank, and the pressure in the vacuum tank is made higher than in the gas removal step.

An eighteenth aspect of the present invention is that in the seventeenth aspect, each of the substrates is disposed so that a plurality of exhaust nozzles, which are vertically provided in line and which introduce the purge gas into the vacuum tank, are positioned between each of the substrates.

A nineteenth aspect of the present invention is that in either one of the seventeenth and eighteenth aspects, fluorine gas that does not contain carbon and oxygen in its chemical structure and contains fluorine is used as the reactive gas, and hydrogen radicals are used as the radicals, and the hydrogen radicals are produced by changing into plasma, a radical production gas that contains either one of hydrogen and ammonia or both, and an etching object formed of silicon oxide is etched.

A twentieth aspect of the present invention is that in any one of the seventeenth through nineteenth aspects, either one of nitrogen gas and argon gas or both are used as the purge gas.

The present inventor performed an investigation of the particles that adhere to the inner wall of the reaction chamber. As a result, it was discovered that when fluorine gas is used as the reactive gas, adhering particles contain many fluorine atoms.

For example, when a silicon substrate is used as the substrate, a silicon oxide film, being the etching object, is formed on the surface thereof. To explain a case where nitrogen fluorine ($NF_3$) gas is used as the reactive gas, nitrogen fluorine gas introduced into the vacuum tank, and hydrogen radicals ($H^\bullet$), react with each other as expressed in the following reaction formula (1), and an intermediate product ($NH_xF_y$) is produced.

$$H^\bullet + NF_3 \rightarrow NH_xF_y \quad (1)$$

Since this intermediate product is highly reactive with the silicon oxide film ($SiO_2$), when the intermediate product reaches the surface of the silicon substrate, it selectively reacts with the silicon oxide film, and a reaction product ($(NH_4)_2SiF_6$) expressed in the right hand formula of the following reaction formula (2) is produced.

$$NH_4F_y + SiO_2 \rightarrow (NH_4)_2SiF_6 + H_2O \quad (2)$$

Next, when the silicon substrate is heated to 100° C. or higher, the reaction product is thermally decomposed as shown in the following reaction formula (3), and a pyrolysis gas is released into the vacuum tank.

$$(NH_4)_2SiF_6 \rightarrow NH_3 + HF + SiF_4 \quad (3)$$

As shown in the above reaction formula (3), the pyrolysis gas contains gases such as HF gas and $SiF_4$ gas, which contain fluorine.

On the other hand, aluminum is widely used for the material of the vacuum tank, and the inner wall of the vacuum tank is anodized and a process film such as aluminum oxide ($Al_2O_3$) film is often formed on the inner wall, and it is presumed that when the pyrolysis gas that contains fluorine is released into the vacuum tank, it reacts with the process film and particles are produced.

In the etching method of the present invention, the purge gas is introduced into the vacuum tank in the heating process, and when the inside of the vacuum tank is evacuated while introducing the purge gas, a purge gas flow is formed in the vacuum tank and the pressure in the vacuum tank increases.

The pyrolysis gas released from the substrate surface flows with this purge gas, and is exhausted from the inside of the vacuum tank along with the purge gas.

Moreover, since the reactive gas and radicals are removed by decreasing the pressure in the vacuum tank before heat application, these gases do not react with the inner wall of the vacuum tank in the heating process.

Since the purge gas exhaust nozzles are provided at positions between the substrates, and the purge gas is not exhausted towards the side wall of the substrate, the purge gas flow flowing between the substrates and the purge gas flow flowing along the inner wall of the vacuum tank become stronger. Therefore, not only is the pyrolysis gas released from the substrate surface more efficiently exhausted, but also, particles do not adhere easily to the inner wall of the vacuum tank even if the process film of the vacuum tank inner wall reacts with the pyrolysis gas, since the particles produced are swept away by the purge gas.

That is, according to the etching method of the present invention, even if highly reactive pyrolysis gas occurs in the vacuum tank, it hardly reaches the vacuum tank inner wall since it is swept away by the purge gas and is exhausted from the vacuum tank. Moreover, even if the pyrolysis gas and the inner wall of the reaction chamber react and particles are produced, these particles are swept away by the purge gas and exhausted from inside of the vacuum tank. Thus, according to the etching method of the present invention, the amount of particle production in the etching process is small, and even if particles are produced, these particles are removed in the heating process. As a result, cleaning is required less frequently compared to the conventional method, and the life time of the vacuum tank becomes longer.

Moreover, if the substrate is rotated in a horizontal plane when introducing the purge gas into the vacuum tank, the entire area from the center of the substrate comes in contact with the purge gas, and the pyrolysis gas can be swept away more efficiently.

DETAILED DESCRIPTION OF THE INVENTION

Hereafter, preferred embodiments of an etching apparatus according to the present invention are described in detail with reference to the drawings.

Figure 1:
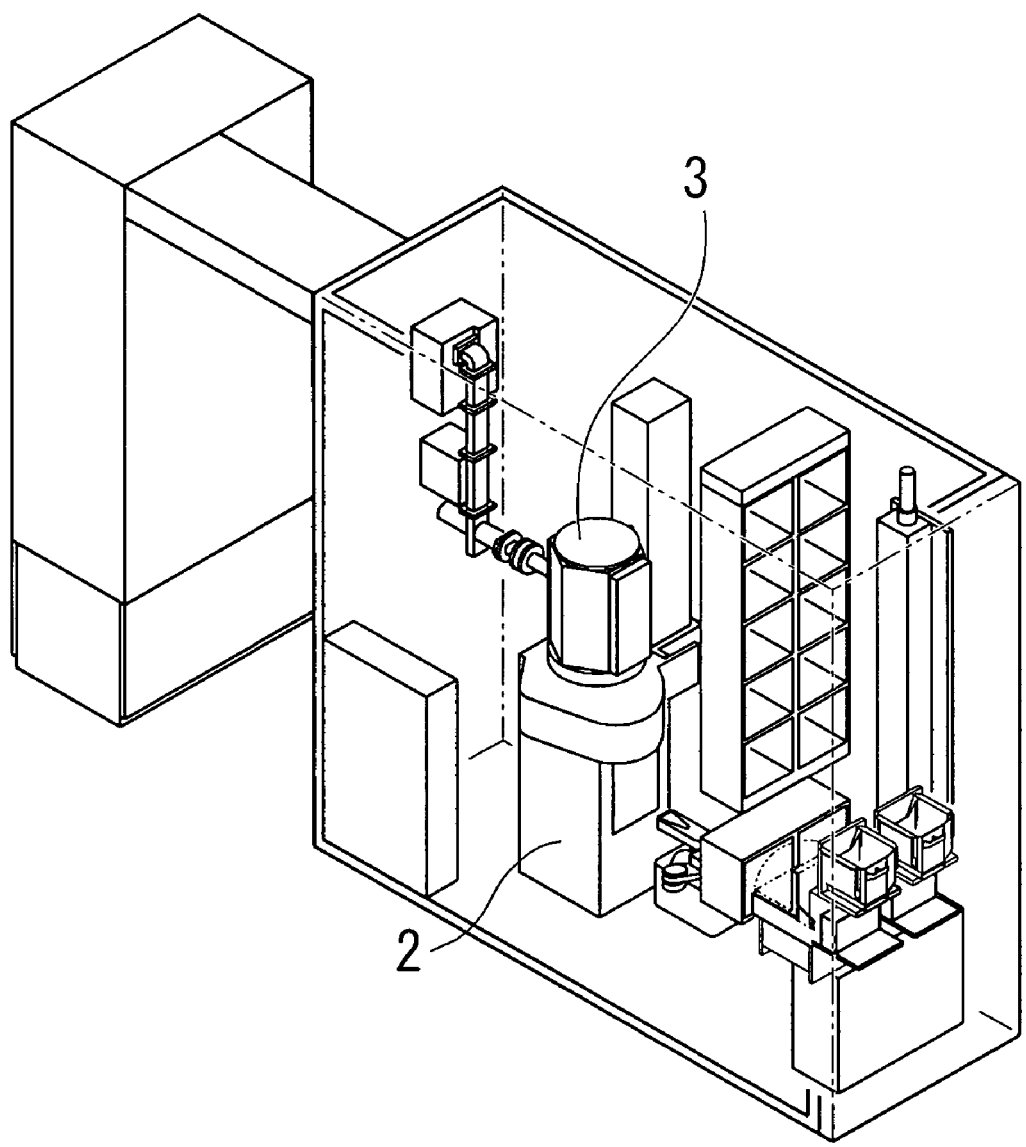
FIG. 1 is a perspective view of an etching apparatus showing one embodiment of the present invention.
Figure 2:
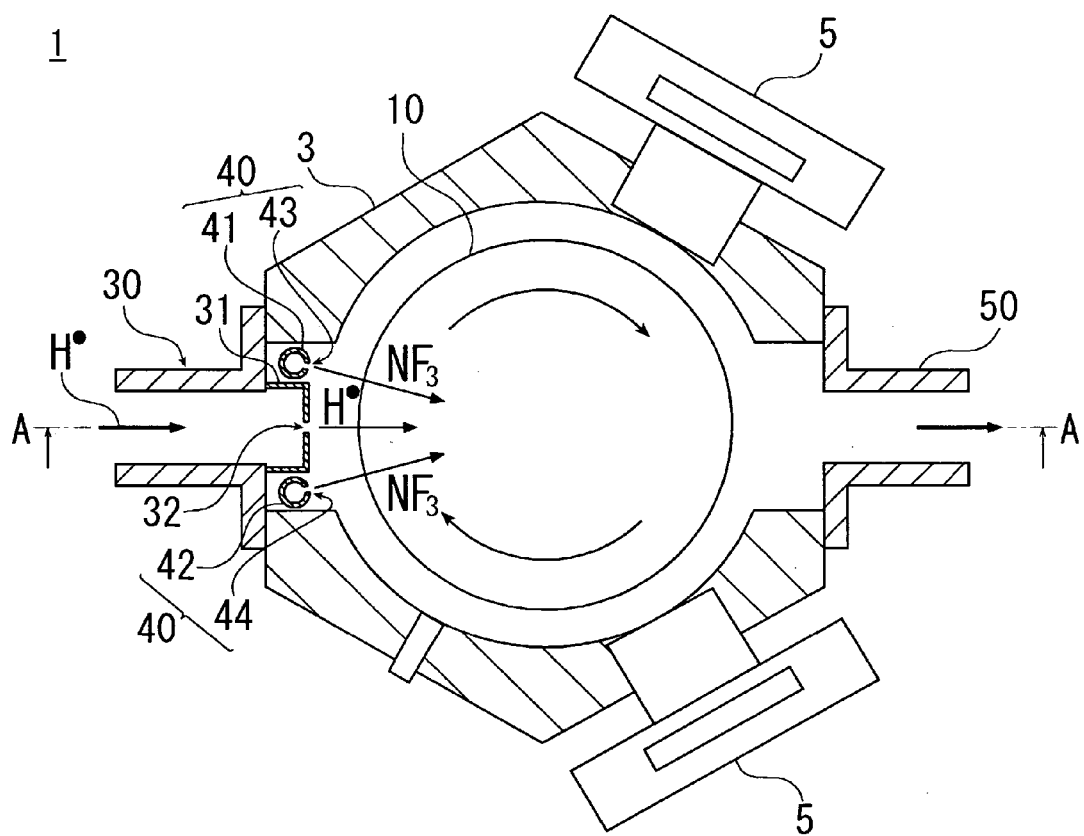
FIG. 2 is a cross-sectional view showing an internal construction of a vacuum processing tank of the same etching apparatus.
Figure 3:
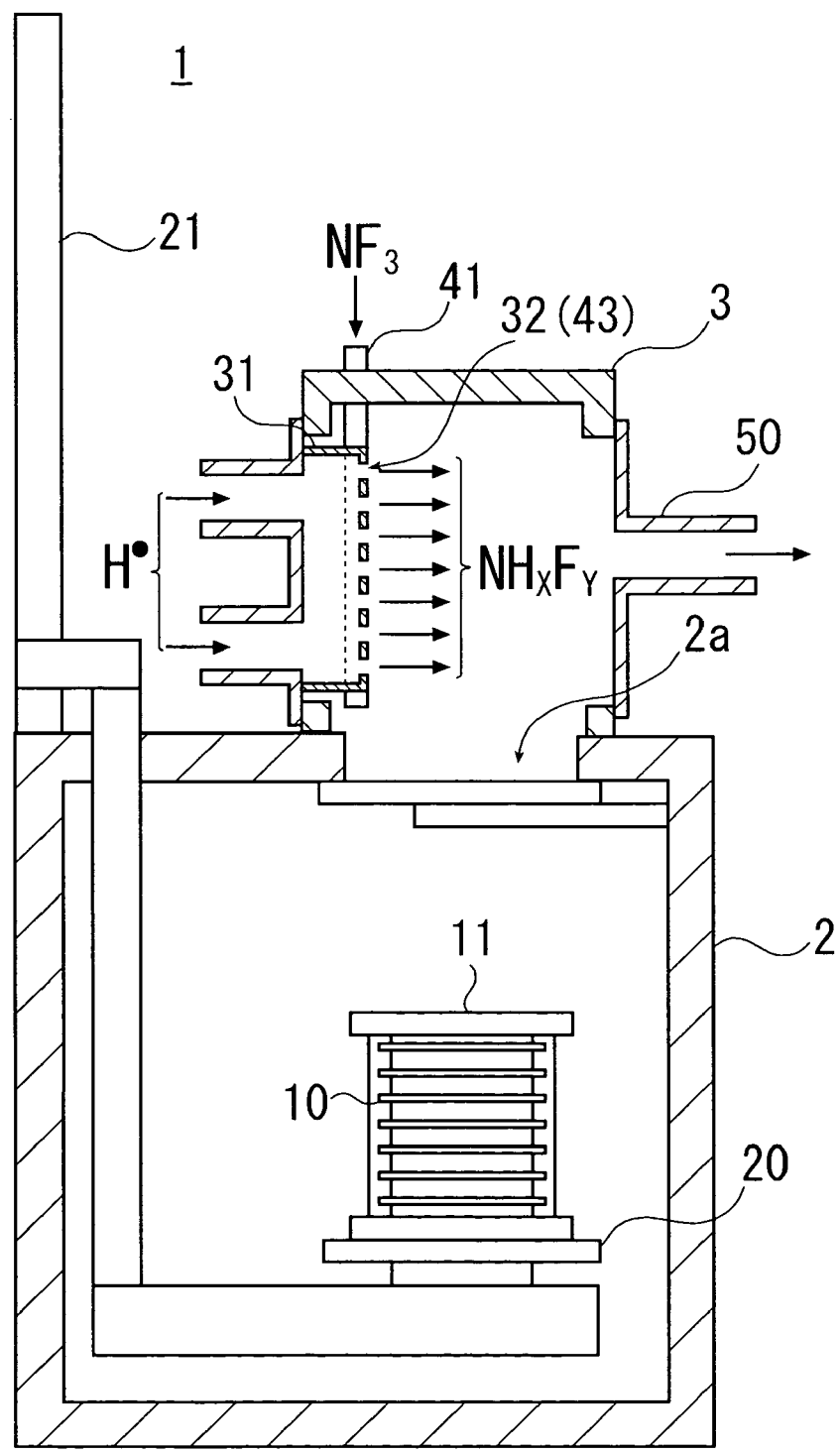
FIG. 3 is a sectional view of FIG. 1 and a sectional view of FIG. 2 along the line A-A.
Figure 4:
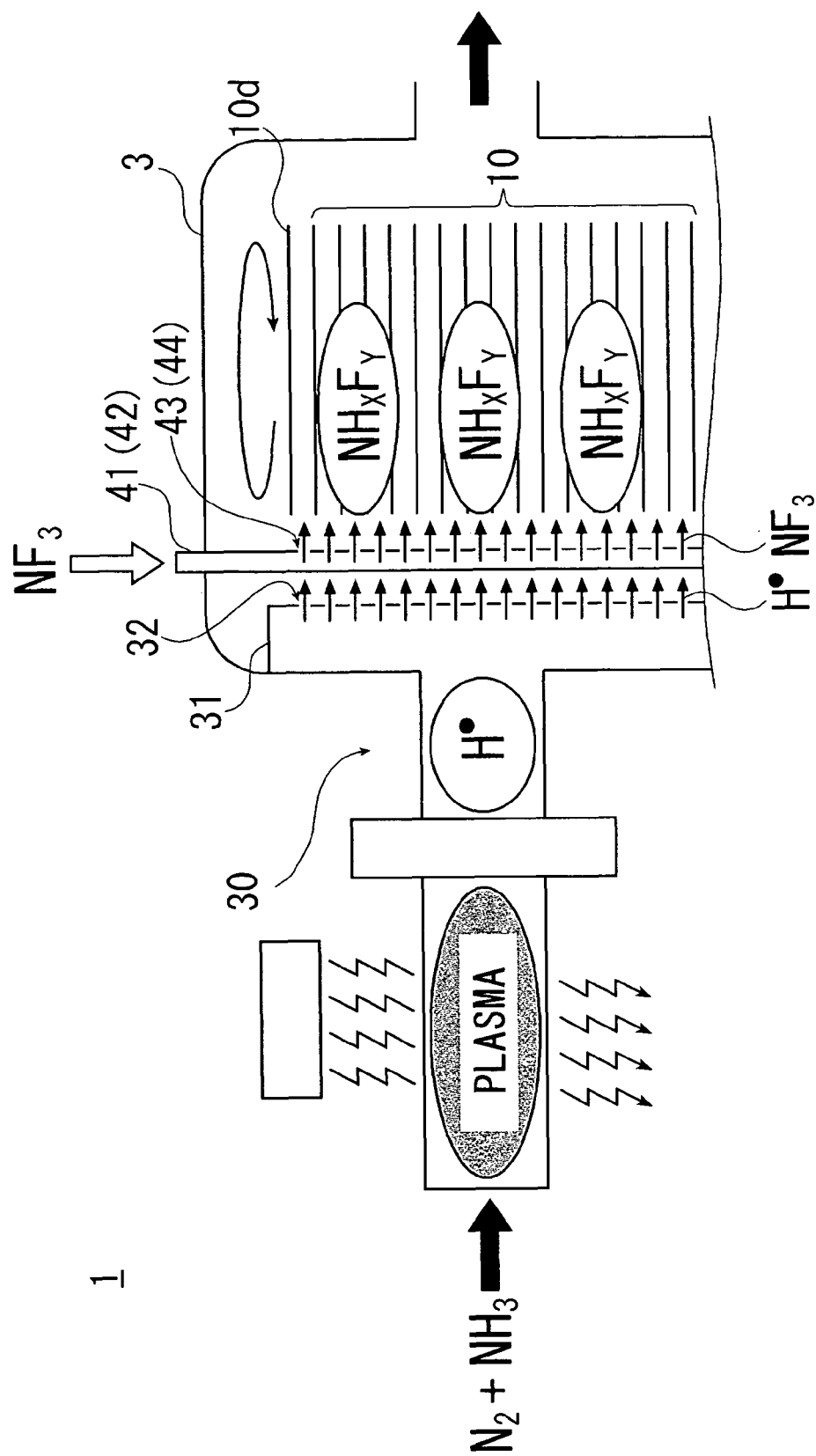
FIG. 4 is diagram for explaining the principles of the present invention.

FIG. 1 to FIG. 3 show one embodiment of the etching apparatus according to the present invention. FIG. 1 is a perspective view of an etching apparatus that shows the present embodiment, FIG. 2 is a cross-sectional view showing an internal construction of a vacuum processing tank of the same etching apparatus, and FIG. 3 is a sectional view of FIG. 1 and a sectional view of FIG. 2 along line A-A. FIG. 4 is diagram for explaining the principle of the present invention.

As shown in FIG. 1 to FIG. 3, the etching apparatus 1 of the present embodiment has a charge extraction tank 2 that is connected to an evacuation system not shown in the diagrams, and a vacuum processing tank 3 provided above the charge extraction tank 2.

A turntable 20 that can be rotated at a predetermined speed by a driving mechanism not shown in the diagrams, is provided in the charge extraction tank 2. The turntable 20 supports a boat 11 that holds semiconductor wafers 10, and can vertically move up and down along a ball screw 21 that is provided on the top of the charge extraction tank 2, extending in the vertical direction.

The charge extraction tank 2 and the vacuum processing tank 3 are connected via a link hole 2a, and the boat 11 is received and delivered by the vertical movement of the turntable 20 mentioned above.

Moreover, the atmospheres in the charge extraction tank 2 and the vacuum processing tank 3 can be isolated at the link hole 2a during processing.

In the present embodiment, the processing is performed by introducing two systems of processing gas into the vacuum processing tank 3. In this case, a first gas introduction section 30 (first processing gas introduction section) that introduces hydrogen radicals (H*) from the lateral side of the vacuum processing tank 3 is provided.

As shown in FIG. 2 to FIG. 4, the first gas introduction section 30 is constructed so that a first processing gas ($N_2$ + $NH_3$ in case of the present embodiment) is turned into a plasma state using microwaves, and hydrogen radicals are introduced via an introduction pipe (first nozzle section) 31 provided in the vacuum processing tank 3.

The introduction pipe 31 is formed in a rectangular pipe shape that extends in the vertical direction, and a plurality of introduction ports 32 are provided in rows on a side face of the introduction pipe 31.

In the case of the present embodiment, a number of semiconductor wafers 10 (approximately 50) is disposed, stacked horizontally at constant intervals in the vacuum processing tank 3 as shown in FIG. 4. Furthermore, dummy substrates 10d are disposed above and below these semiconductor wafers 10.

In the case of the present embodiment, each of the introduction ports 32 of the introduction pipe 31 is formed in a circular shape for example. Although the diameter of each of the introduction ports 32 of the introduction pipe 31 is not particularly limited, it is preferably smaller than the interval of the semiconductor wafers 10 with a view to improving the in-plane uniformity. Furthermore, each of the introduction ports 32 of the introduction pipe 31 is preferably provided in the positions between each of the semiconductor wafers 10 disposed in the vacuum processing tank 3 with a view to improving the in-plane uniformity.

Furthermore, the direction of each introduction port 32 of the introduction pipe 31 is set between these semiconductor wafers 10 so that H radicals are introduced toward the center part of each semiconductor wafer 10.

Moreover in the present embodiment, a pair of second gas introduction sections 40 (second processing gas introduction sections) is provided, sandwiching from above and below the introduction pipe 31 of the first gas introduction section 30. These second gas introduction sections 40 are connected to the gas supply source not shown in the diagram, and have a pair of pipe shaped shower nozzles 41 and 42 that extend in the vertical direction.

The shower nozzles 41 and 42 of the present embodiment are disposed in a position that is symmetric with the direction of introduction of the H radicals of the first gas introduction section 30.

The plurality of the introduction ports 43 and 44 are provided respectively on these shower nozzles 41 and 42. Each of the introduction ports 43 and 44 of the shower nozzle 41 is formed in a circular shape for example. Although the diameter of each of the introduction ports 43 and 44 of the shower nozzle 41 is not particularly limited, it is preferably smaller than the interval of the semiconductor wafers 10 with a view to improving the in-plane uniformity. Furthermore, each of the introduction ports 43 of the shower nozzle 41 is preferably provided at positions between each of the semiconductor wafers 10 disposed in the vacuum processing tank 3 with a view to improving the in-plane uniformity.

Moreover, the direction of each introduction port 43 and 44 of the shower nozzles 41 and 42 is set between these semiconductor wafers 10 so that $NF_2$ is introduced toward the center part of each semiconductor wafer 10.

As shown in FIG. 2, in the case of the present embodiment, although the introduction port 32 of the introduction pipe 31, which is the H radical introduction side, and each of the introduction ports 43 and 44 of the shower nozzle, which is the $NF_3$ introduction side, are provided in the positions equally distant from the center part of the semiconductor wafers 10, for the convenience of description they are drawn to have different distances from the center part of the semiconductor wafers 10 in FIG. 4.

Moreover in the case of the present embodiment, it is constructed so that an exhaust section 50 is provided in the position opposed to the first and second gas introduction sections 30 and 40 of the vacuum processing tank 3, and evacuation is performed through this exhaust section 50.

Also, lamp heaters 5 are provided in the vacuum processing tank 3 for thermally decomposing, and vaporizing, the intermediate product.

When the etching process is performed on the semiconductor wafers 10 in the etching apparatus 1 of the present embodiment being thus constructed, the boat 11 holding the semiconductors 10 is carried into the vacuum processing tank 3 and the inside of the chamber is made airtight, and evacuation is performed to achieve a predetermined pressure.

Moreover hydrogen radicals are introduced from the introduction port 32 of the introduction pipe 31 of the first gas introduction section 30 as shown in FIG. 4, while $NF_3$ is introduced from the introduction ports 43 and 44 of the shower nozzles 41 and 42 of the second gas introduction section 40, and these are mixed and reacted.

The reaction formulas in this case are considered to be the formulas (1) and (2) below.

$$H^\cdot + NF_3 \rightarrow NH_xF_y \text{ (}NH_4FH, NH_4FHF \text{ etc.)} \tag{1}$$

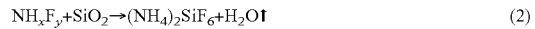

$$NH_xF_y + SiO_2 \rightarrow (NH_4)_2SiF_6 + H_2O\uparrow \tag{2}$$

Specifically, the reaction product $((NH_4)_2SiF_6)$ is formed as a result of the reaction of $NH_xF_y$ and the natural oxide film $(SiO_2)$ on the surface of the semiconductor wafers 10.

Afterwards, the above mentioned reaction product is decomposed and exhausted by heating the semiconductor wafers 10 at a predetermined temperature with the lamp heater 5. The reaction formula of this case is considered to be the formula (3) below.

$$(NH_4)_2SiF_6 \rightarrow NH_3\uparrow + HF\uparrow + SiF_4\uparrow \tag{3}$$

As described above, according to the present embodiment, since the second gas introduction section 40 has two shower nozzles 41 and 42 provided in the positions on either side of the introduction pipe 31 of the first gas introduction section 30, $HF_3$ gas acts, for example, as a gas curtain with respect to the H radicals introduced from the first gas introduction section 30. As a result, the $NF_3$ gas can be flowed in bilateral symmetry to the flow of the H radicals, and the comparatively short-lived H radicals can be efficiently guided onto the semiconductor wafers 10. Also as a result, the in-plane uniformity after processing can be improved since the reactive intermediate product is generated uniformly on the surface of the semiconductor wafers 10.

Moreover, according to the present embodiment the processing speed can be improved since the short-lived H radicals can be efficiently introduced.

Specifically, in the present embodiment, the symmetry of the $HF_3$ gas to the flow of the H radicals can be improved since the shower nozzles 41 and 42 of the second gas introduction section 40 are provided in a position symmetric with the direction of introduction of gas of the first gas introduction section 30. As a result, the short-lived first processing gas can be more efficiently guided onto the processing object.

Furthermore, since it is so that the first and second gas introduction sections 30 and 40 guide the H radicals and the $NF_3$ gas respectively to the center part of the semiconductor wafers 10, the reactive intermediate product is generated even more uniformly on the surface of the semiconductor wafers 10. As a result, the in-plane uniformity after processing can be further improved.

Moreover, in the present embodiment, it is constructed so that the introduction port 32 of the first gas introduction section 30 and the introduction ports 43 and 44 of the second gas introduction section 40 introduce the H radicals and the $NF_3$ gas respectively to in between a plurality of the semiconductor wafers 10 disposed at predetermined intervals. As a result, the in-plane uniformity after processing of the plurality (many) of the semiconductor wafers 10 can be improved, while uniformity between the plurality of processing objects can be improved and several semiconductor wafers 10 can be uniformly processed in a short period of time.

Also, the present invention is not limited to the embodiment described above and may be performed with various modifications.

For example, although in the embodiment described above, two shower nozzles 41 and 42 were provided at positions on either side of the introduction pipe 31 of the first gas introduction section 30, the present invention is not limited to this, and four or more shower nozzles may be provided as long as they are positioned around the introduction pipe 31 of the first gas introduction section 30.

Moreover, although the embodiment described above was constructed such that the first and second gas introduction sections 30 and 40 guide the H radicals and the $NF_3$ gas respectively to the center part of the semiconductor wafers 10, the present invention is not limited to this, and the introduction direction of the H radicals and the $NF_3$ gas may be arbitrarily changed as long as the in-plane uniformity after processing is not impaired.

Furthermore, the present invention is applicable not only to an etching apparatus, but may also be applicable to an ashing apparatus for example.

Hereafter, a working example of the etching apparatus according to the present invention is described in detail along with comparative examples.

Working Example

The surfaces of semiconductor wafers were subjected to etching processing using the etching apparatus described above.

In this case, 50 semiconductor wafers were disposed being horizontally stacked with an interval of 6.35 mm. The diameter of the introduction port for the H radicals was 3 mm, and the diameter of the introduction ports for the $NF_3$ was 0.5 mm. Also, the $NH_3$ flow rate was 1.5 slm and the $NF_3$ flow rate was 5 slm, and the pressure inside the vacuum processing tank was adjusted to be 1 Pa.

Comparative Example

The etching processing was performed under the same conditions as the working example, except that only one shower nozzle was provided for the second gas introduction section.

Figure 5:
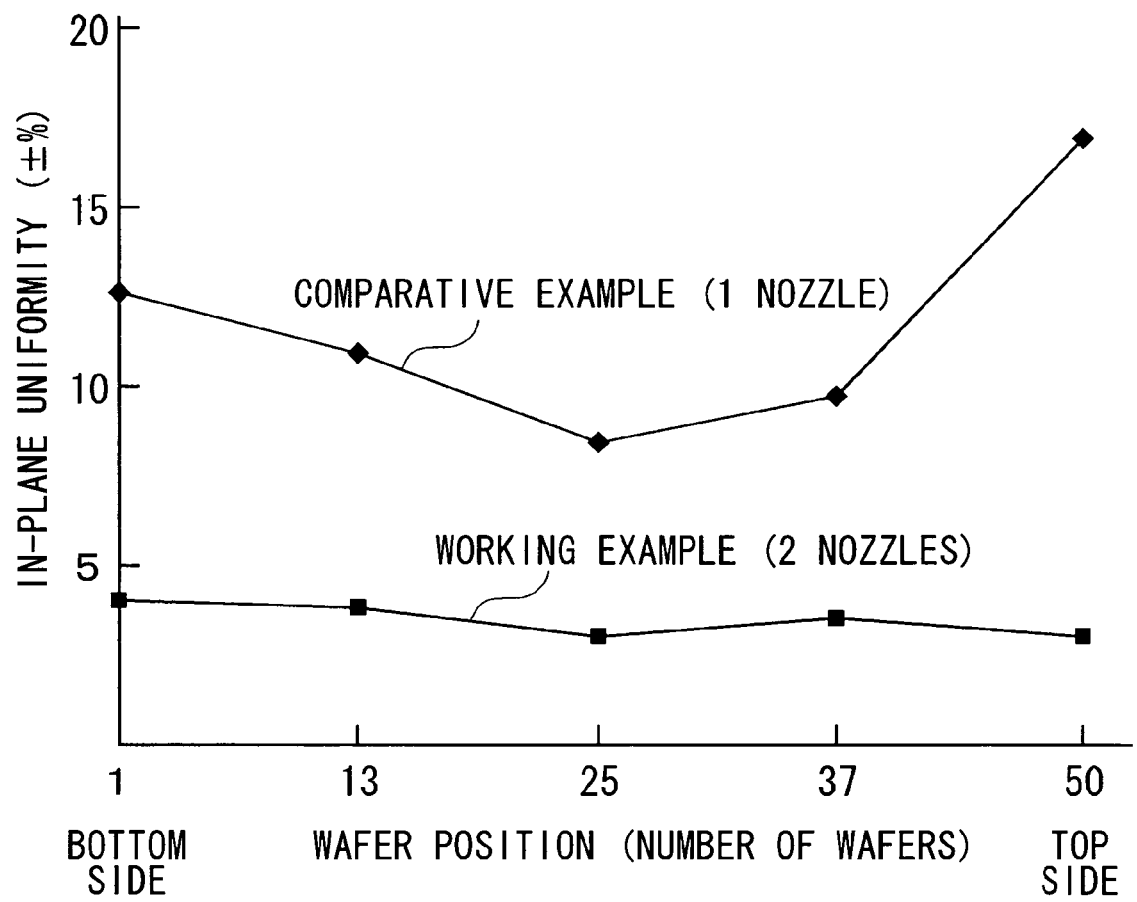
FIG. 5 is a graph showing in-plane uniformities after etching of a working example of the present invention and a comparative example.
Figure 6:
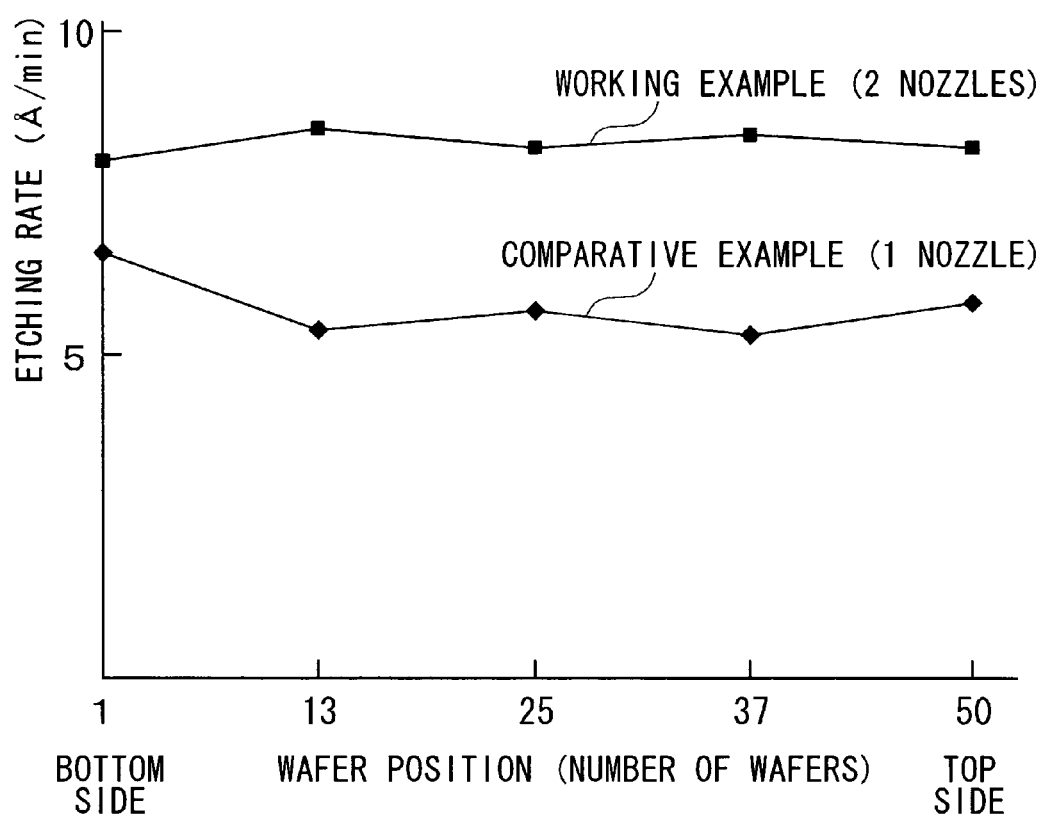
FIG. 6 is a graph showing etching rates according to the working example of the present invention and according to the comparative example.

FIG. 5 is a graph showing the in-plane uniformities after etching according to the working example, and etching according to the comparative example, and FIG. 6 is a graph showing the etching rates according to the working example and according to the comparative example.

As shown in FIG. 5, the etching apparatus of the working example has largely improved in-plane uniformity of the semiconductor wafer in each position, compared to the etching apparatus of the comparative example. Also as shown in FIG. 6, the etching rates of the semiconductor wafers in each position have been largely improved.

FIG. 7 to FIG. 10 show another embodiment of an etching apparatus according to the present invention. Parts in the following description having the same construction as for the etching apparatus 1 shown in FIG. 1 to FIG. 3 are given the same reference symbols as those in FIG. 1 to FIG. 3 and descriptions thereof is omitted.

Figure 7:
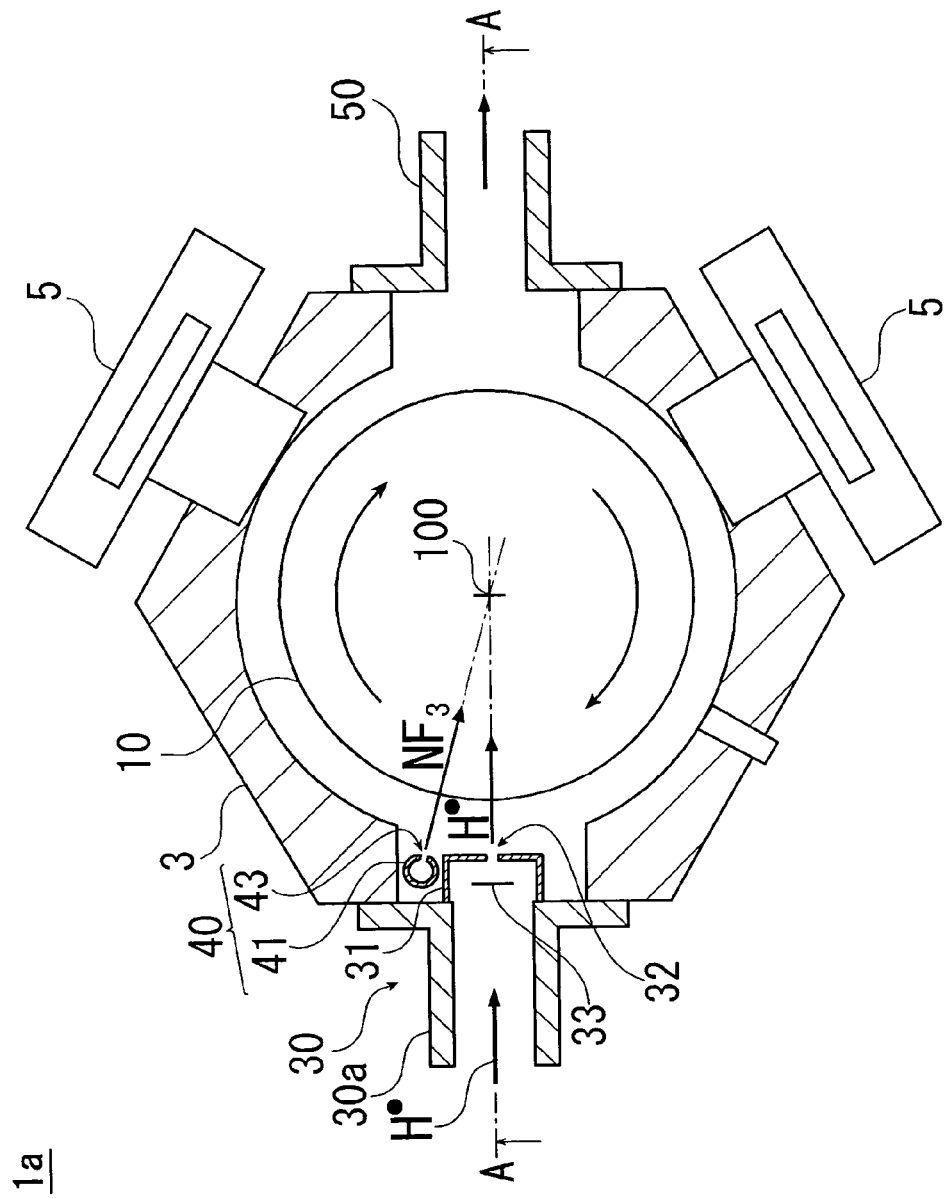
FIG. 7 shows another embodiment of the present invention, being a cross-sectional view showing the internal construction of a vacuum processing tank of the etching apparatus.
Figure 8:
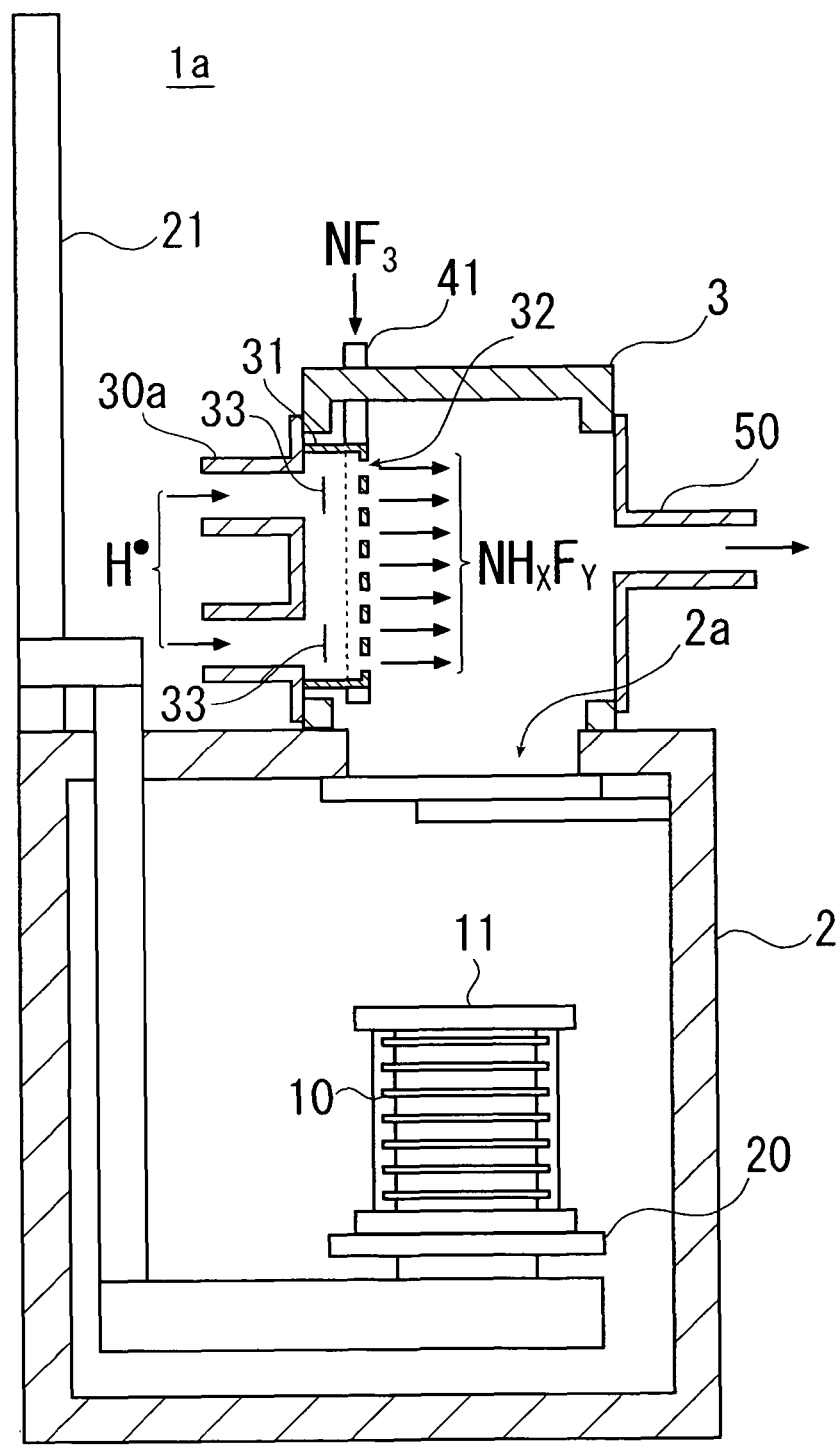
FIG. 8 is a sectional view of FIG. 7 along the line A-A.

FIG. 7 is a cross-sectional view showing an internal construction of a vacuum processing tank of an etching apparatus 1*a* of the present embodiment, and FIG. 8 is a sectional view along a line A-A in FIG. 7.

In the present embodiment, the construction is such that plate shaped diffusion members 33 are provided between each introduction passage 30*a* and each introduction port 32, and these diffusion members 33 diffuse the H radicals along an introduction pipe 31 and uniformly exhaust the H radicals from each introduction port 32.

Moreover a second gas introduction section 40 (second processing gas introduction section) is provided in the place adjacent to the introduction pipe 31 of the first gas introduction section 30 in the vacuum processing tank 3. This second gas introduction section 40 is connected to a gas supply source not shown in the diagram, and has a pipe shaped shower nozzle (nozzle section), which extends in the vertical direction.

Specifically, the shower nozzle 41 of the present embodiment is constructed so that $NF_3$ passes through a central axis of rotation 100 of the semiconductor wafer 10.

Also, as shown in FIG. 7, in the case of the present embodiment, although the introduction port 32 of the introduction pipe 31, which is the H radical introduction side, and each of the introduction ports 43 and 44 of the shower nozzle, which is the $NF_3$ introduction side, are provided at positions equally distant from the center parts of the semiconductor wafers 10, for convenience of description they are drawn in FIG. 8 to have different distances from the center parts of the semiconductor wafers 10.

According to the present embodiment, since this has the introduction pipe 31 and the shower nozzle 41 that respectively guide the H radicals and the $NF_3$ so that they pass the center part of the substrate 10, especially the rotation central axis 100, the H radicals and the $NF_3$ react at the center part of the substrate 10 and the reactive intermediate product can be produced uniformly towards the outer periphery of the surface of the substrate 10. Therefore, the in-plane uniformity after processing can be improved.

Moreover in the present embodiment, the construction is such that the introduction port 32 of the first gas introduction section 30 and the introduction port 43 of the second gas introduction section 40 introduce the H radicals and the $NF_3$ gas respectively to in between a plurality of the semiconductor wafers 10 disposed at predetermined intervals. Therefore, the in-plane uniformity on the plurality of semiconductor wafers 10 after processing can be improved. As a result, a number of semiconductor wafers 10 can be processed in a short period of time.

Figure 9:
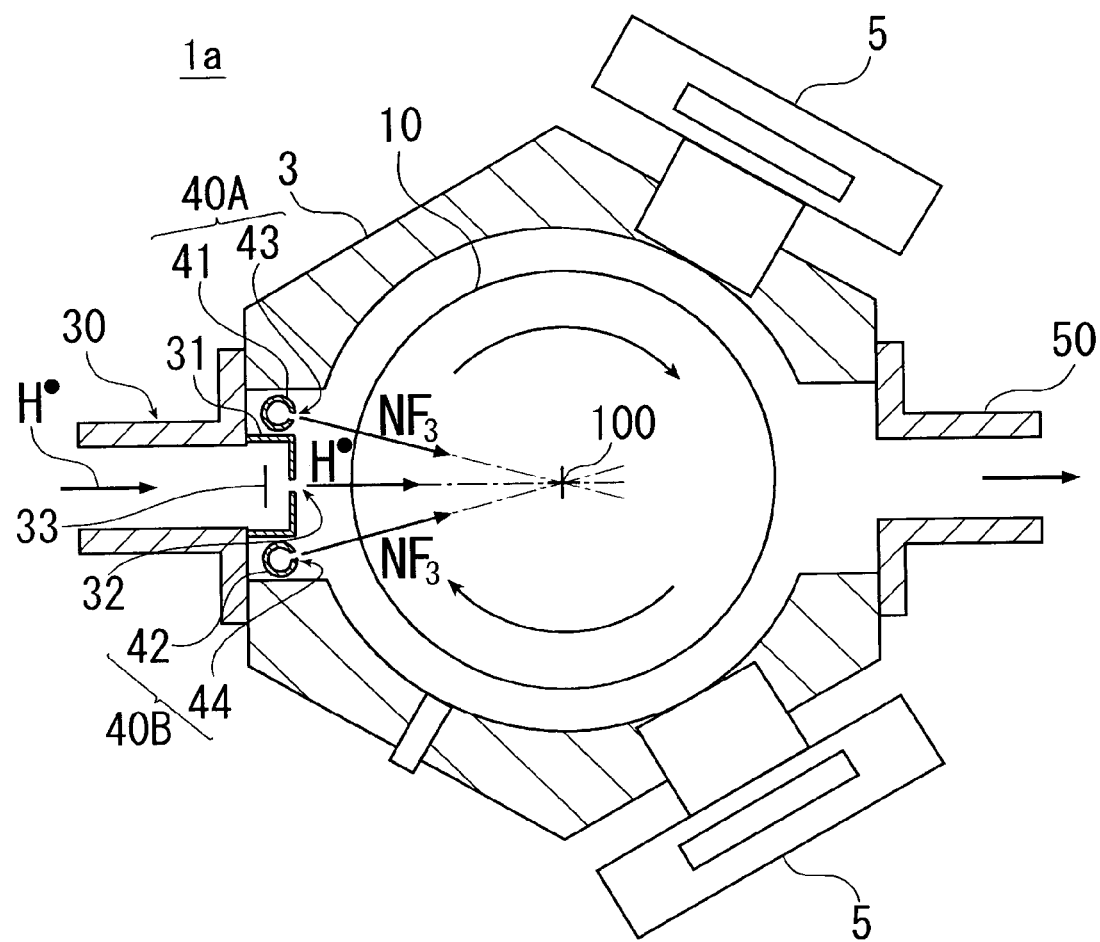
FIG. 9 is a cross-sectional view showing an internal construction of a modified example of the vacuum processing tank of the etching apparatus shown in FIG. 7.

FIG. 9 shows a modified example of the etching apparatus 1*a* of the present embodiment, being a cross-sectional view showing the internal construction of the vacuum processing tank 3.

In this example, a pair of second gas introduction sections 40 are provided, one on either side of the introduction pipe 31 of the first gas introduction section 30. These second gas introduction sections 40 are connected to a gas supply source not shown in the diagram, and have a pair of pipe shaped shower nozzles 41 and 42 that extend in the vertical direction. Also, the shower nozzles 41 and 42 are disposed in a position that is symmetric with the direction of introduction of the H radicals of the first gas introduction section 30, and a plurality of the introduction ports 43 and 44 are provided respectively on each of the shower nozzles 41 and 42.

Also, in this example, the direction of the each introduction port 32 for the H radicals and the directions of each of the introduction ports 43 and 44 for the $NF_3$ are set towards the center parts of the each semiconductor wafers 10 (in the direction passing through the rotation central axis in FIG. 9) between the semiconductor wafers 10.

According to the etching apparatus 1*a* thus constructed, the H radicals and the $NF_3$ can be guided to the center part of the substrate 10 symmetrically, and as a result, uniformity of the reactive intermediate product can be enhanced and in-plane uniformity after processing can be all the more improved. As the other constructions and application effects thereof are the same as for the embodiment described above, their detailed description is omitted.

The present invention is not limited to the embodiment described above and may be performed with various modifications.

For example, although the introduction pipe 31 of the first gas introduction section 30 and the shower nozzle 41 (42) of the second gas introduction section 40 were disposed adjacent to each other and in a position opposed to the exhaust section 50 in the vacuum processing tank 3, the present invention is not limited to this. That is, the positions of the introduction pipe 31 and the shower nozzle 41 (42) can be modified arbitrarily as long as the construction is such that the processing gas is guided to the central part of the semiconductor wafers 10.

Furthermore, the present invention is applicable not only to an etching apparatus, but may also be applicable to an ashing apparatus for example.

Hereafter, a working example of the etching apparatus according to the present invention is described in detail along with comparative examples.

Working Example

Using the etching apparatus shown in FIG. 9, the surface of a semiconductor wafer was subjected to etching processing in which H radicals and $NF_3$ were introduced so as to pass through the central axis of rotation of each semiconductor wafer, between the semiconductor wafers.

In this case, 50 semiconductor wafers were disposed being horizontally stacked with an interval of 6.35 mm. The diameter of the introduction ports for the H radicals was 3 mm, and the diameter of the introduction ports for the $NF_3$ was 0.5 mm. Also the $NH_3$ flow rate was 1.3 slm and the $NF_3$ flow rate was 4 slm, and the pressure inside the vacuum processing tank was adjusted to be 400 Pa.

Comparative Example 1

Etching processing was performed under the same conditions as for the working example, except that the directions of the $NF_3$ introduction of the shower nozzles for the second gas introduction section were made to oppose each other.

Comparative Example 2

Etching processing was performed under the same conditions as for the working example, except that direction of the $NF_3$ introduction of the shower nozzles of the second gas introduction section was made to face in the direction towards the outer periphery of the semiconductor wafer (the inner wall of the vacuum processing tank).

Figure 10:
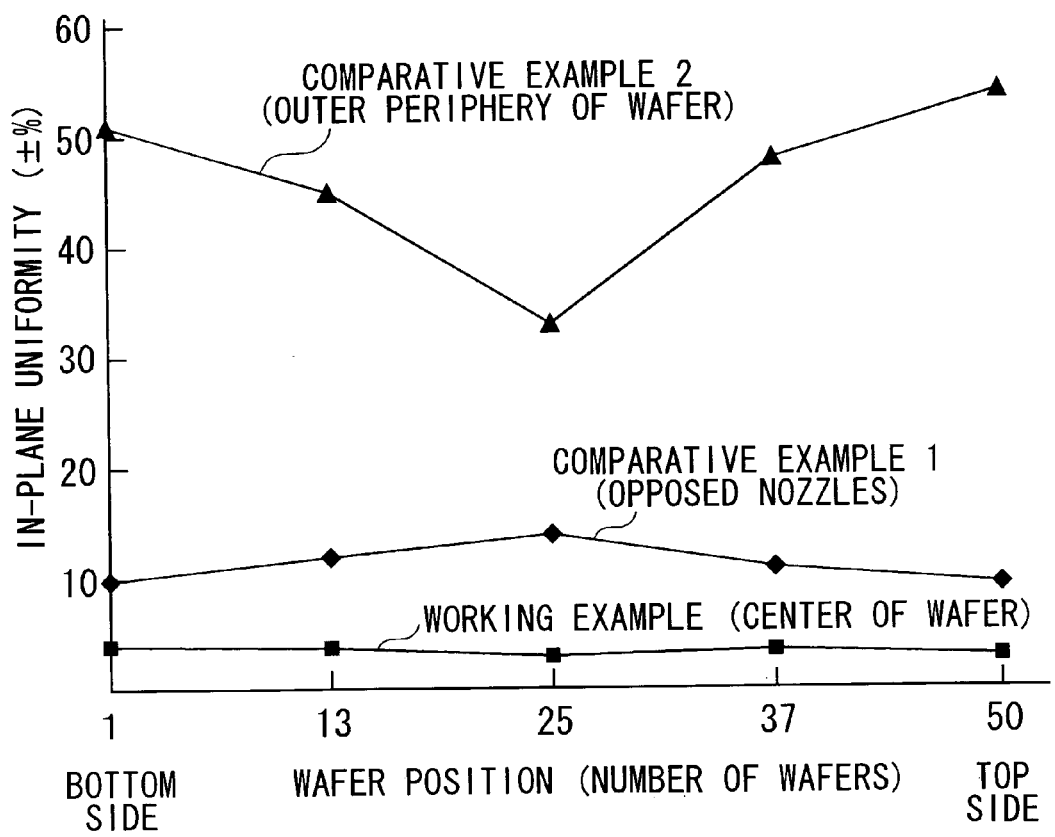
FIG. 10 is a graph showing in-plane uniformities after etching of a working example of the present invention and a comparative example.
Figure 17:
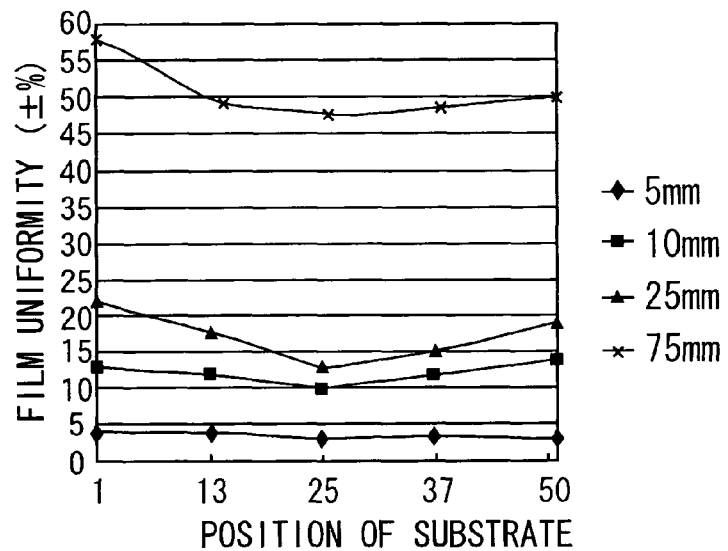
FIG. 17 is a graph showing the relationship between the position of the substrate and the uniformity of the thickness of the film.

FIG. 10 is a graph showing the in-plane uniformities after etching, for the working example and the comparative examples 1 and 2. As shown in FIG. 10, it is clear that the etching apparatus of the working example has largely improved in-plane uniformity of the semiconductor wafers in each position, compared to the etching apparatus of the comparative examples 1 and 2.

An embodiment of an etching method according to the present invention is described below.

Figure 11:
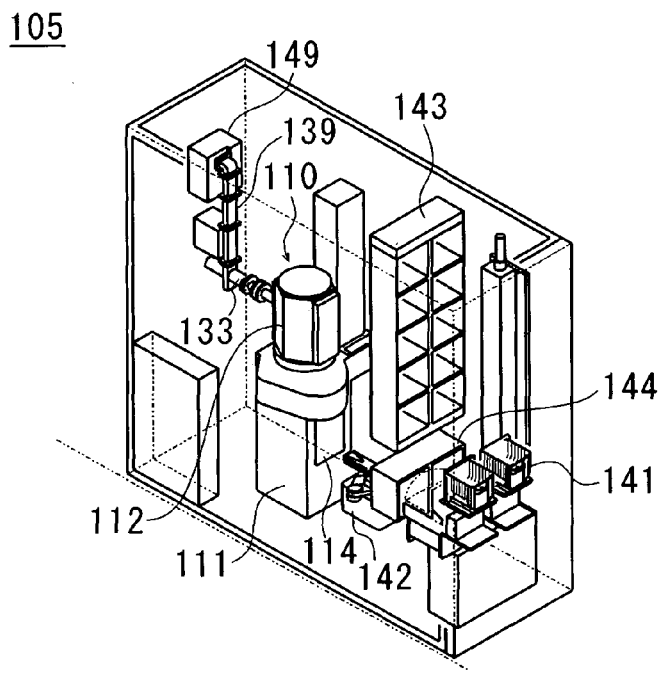
FIG. 11 is a perspective view showing an etching apparatus including a reaction apparatus that can be used for the present invention.

Reference symbol 105 in FIG. 11 denotes the etching apparatus to which the present invention is applied. The etching apparatus 105 has a reaction apparatus 110, a transfer robot 142, a stacker 143, and a work bench 144.

The reaction apparatus 110 has a transfer chamber 111 and a reaction chamber 112. The transfer chamber 111 is installed on the ground, and the reaction chamber 112 is disposed on top of the transfer chamber 11. Also, a transfer port 114 is provided on one side face of the transfer chamber 111.

The transfer robot 142, the stacker 143, and the work bench 144 are disposed near the transfer port 114.

A cassette 141 in which processing object substrates are stored, is disposed on the work bench 144. The transfer robot 142 is constructed so that: it takes out the substrates loaded in the cassette 141 one by one; carries the substrates into the transfer chamber from the transfer port 114; lets a boat 123, which will be described later, in the transfer chamber 111 hold the substrates; then takes out the substrates held by the boat 123 one by one from the transfer chamber 111 after the processing in the etching apparatus 105 is complete; and returns the substrates to the cassette 141. Moreover, the cassette 141 loaded with the processed substrates and the cassette 142 loaded with unprocessed substrates can be stored in the stacker 143.

Figure 12:
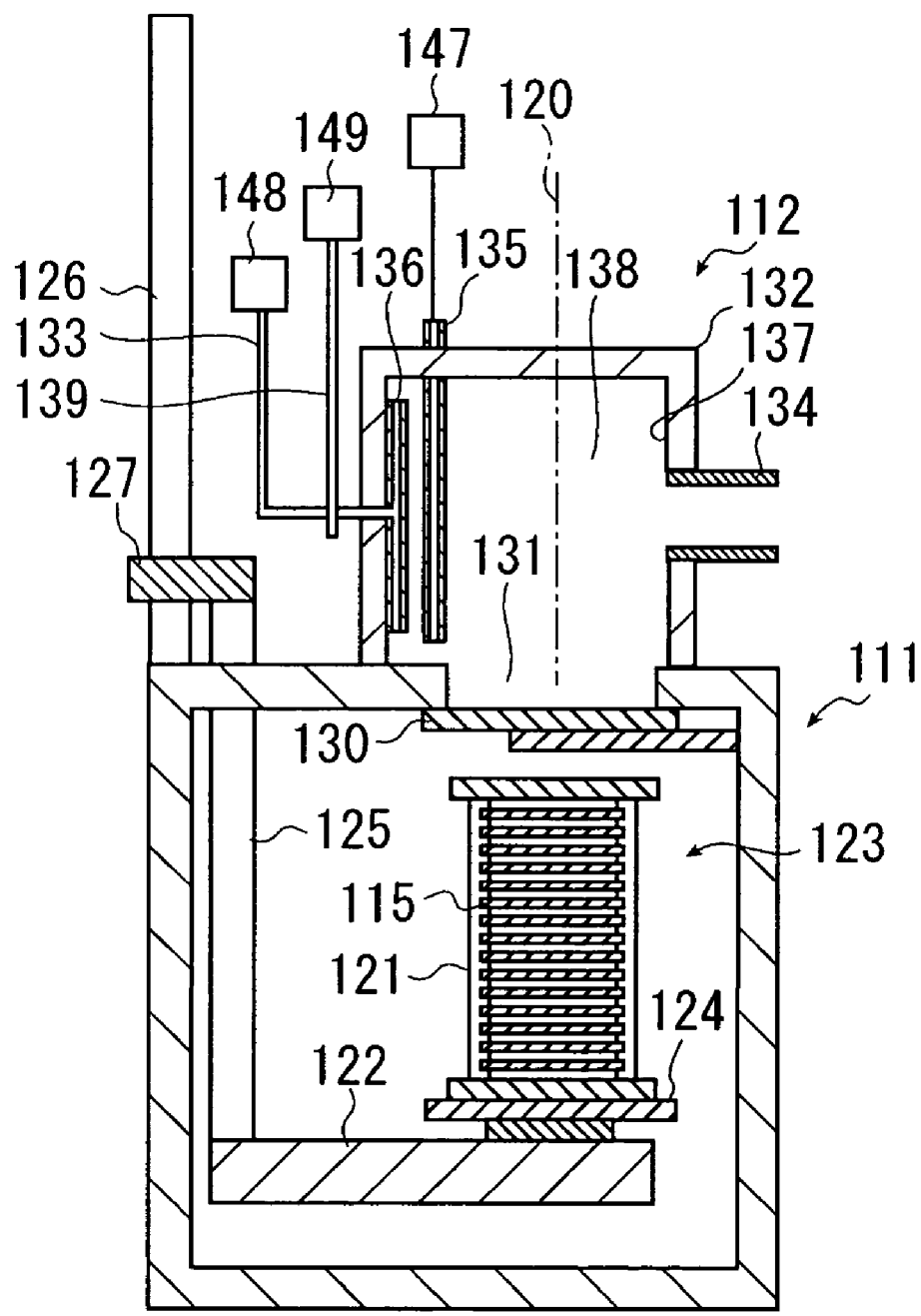
FIG. 12 is a diagram showing one example of the reaction apparatus that can be used for the present invention.

Next, the inside of the reaction apparatus 110 is described. FIG. 12 shows the internal structure of the reaction apparatus 110. A guide bar 126 is attached vertically to the reaction apparatus 110, and a ring 127 is movably fitted on the guide bar 126.

A support bar 125 passes through the transfer chamber 111, and its top end part is positioned outside the transfer chamber 111 and is attached to the ring 127. Also, the bottom part of the support bar 125 is positioned inside the transfer chamber 111 and a support bench 122 is attached horizontally thereto.

A seal plate 124 is disposed on the support bench 122, and the boat 123 is disposed on a top part thereof. The boat 123 has a plurality of columns 121 that are vertically disposed (two or three columns here), and a plurality of horizontally inscribed thin grooves are disposed at constant intervals in the heightwise direction on the individual columns 121. The thin grooves that oppose each other on the individual columns 121 are positioned at the same height, and when a substrate is carried into the transfer chamber 111 by the transfer robot 142 and is inserted into the grooves, the substrate is held horizontally. Reference symbol 115 in FIG. 12 denotes a plurality of substrates held horizontally by the boat 123.

A passage 131 is formed between the transfer chamber 111 and the reaction chamber 112. This passage 131 is opened and closed by a valve 130. Moreover, when the valve 130 is closed and the passage 131 is blocked, the atmosphere between the transfer chamber 111 and the reaction chamber 112 is shut off. When air enters the transfer chamber 111 when the substrate 115 is being held by the boat 123, or when the substrate 115 held by the boat 123 is being taken out to the atmosphere, the valve 130 shuts the passage 131 and prevents air entering into the reaction chamber 112. Therefore, even when air enters into the transfer chamber 11, the reaction chamber 12 can be evacuated.

Reference symbol 134 denotes an evacuation system that evacuates the inside of the reaction chamber 1112. The inside of the reaction chamber 112 is continuously evacuated by the evacuation system 134 in the following process.

When the valve 130 is open and the passage 131 is opened, the atmosphere between the transfer chamber 111 and the reaction chamber 112 is connected. In order that air does not enter into the reaction chamber 112, the transfer chamber 111 is evacuated and is depressurized to substantially the same low pressure as the reaction chamber 112 before the valve 130 is opened.

Once a predetermined number of the substrates 115 are loaded on the boat 123, the transfer port 114 is closed by a door not shown in the diagram, and the atmosphere inside the transfer chamber 111 is isolated from the outer atmosphere.

The inside of the transfer chamber 111 is evacuated in this state, and when the pressure has been lowered to a predetermined pressure, the valve 130 is moved away from above the passage 131, and the support bench 122 is lifted together with the support bar 25 by a motor not shown in the diagram, so that the boat 123 is lifted by the support bench 122.

The boat 123 is positioned beneath the passage 131, and when the valve 130 is kept open and the boat 123 is lifted, the boat 123 is carried into the reaction chamber 112.

Figure 13:
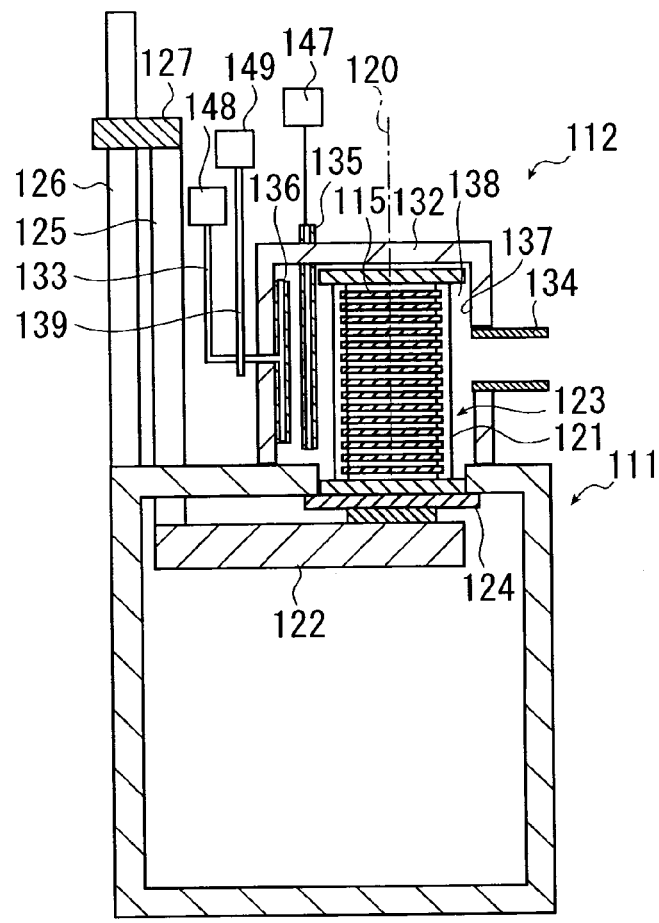
FIG. 13 is a diagram showing a state in which a boat of the reaction apparatus shown in FIG. 12 is carried into a reaction chamber loaded with substrates.

In a state with the support plate 122 lifted up to the topmost part, the seal plate 124 substitutes for the valve 130 and blocks the passage 131 as shown in FIG. 13. In this state, the atmosphere inside the reaction chamber 112 is isolated from the atmosphere inside the transfer chamber 111, and the gas introduced into the reaction chamber 112 can be prevented from entering the transfer chamber 111.

Figure 14:
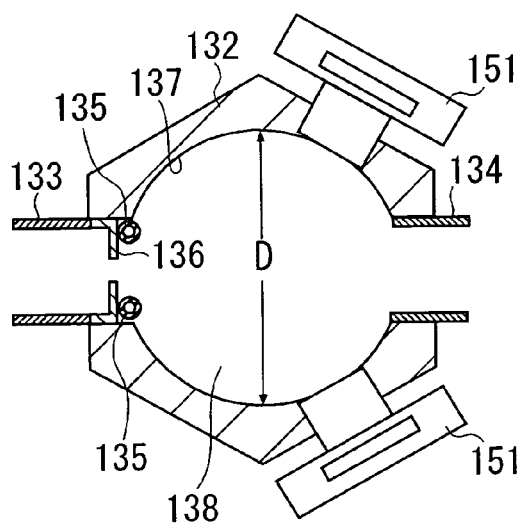
FIG. 14 is a transverse sectional view of the reaction chamber of the reaction apparatus shown in FIG. 12.

FIG. 14 shows a plan view of the interior of the reaction chamber 112.

Reference symbol 132 denotes a side wall that constitutes the reaction chamber 112. A vertically extending cylinder shaped reaction space 138 is formed inside the reaction chamber 112 by the area surrounded by a wall face 137 which is an inner peripheral face of the side wall 132, and a ceiling and a bottom plate surface. Reference symbol 120 in FIG. 12 and FIG. 13 denotes the central axis of the reaction space 138. The central axis 120 extends in the vertical direction, and the direction perpendicular to the central axis 120 is the horizontal direction. The cross-section of the reaction space 138 along the horizontal direction is circular. Moreover, reference symbol D in FIG. 13 denotes the diameter of this circular shape.

The substrates 115 held by the boat 123 have a circular shape, and the diameter D of the reaction space 138 is greater than the diameter of the processing object substrates 115.

Figure 15:
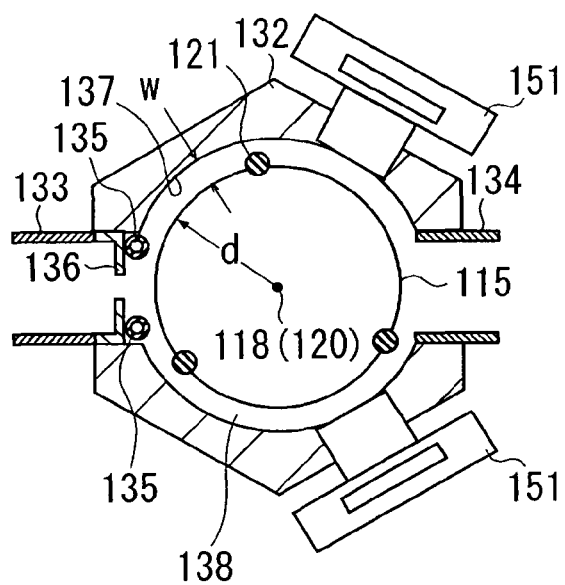
FIG. 15 is a cross-sectional view showing a state in which substrates are carried into the reaction chamber of the reaction apparatus shown in FIG. 12.
Figure 16:
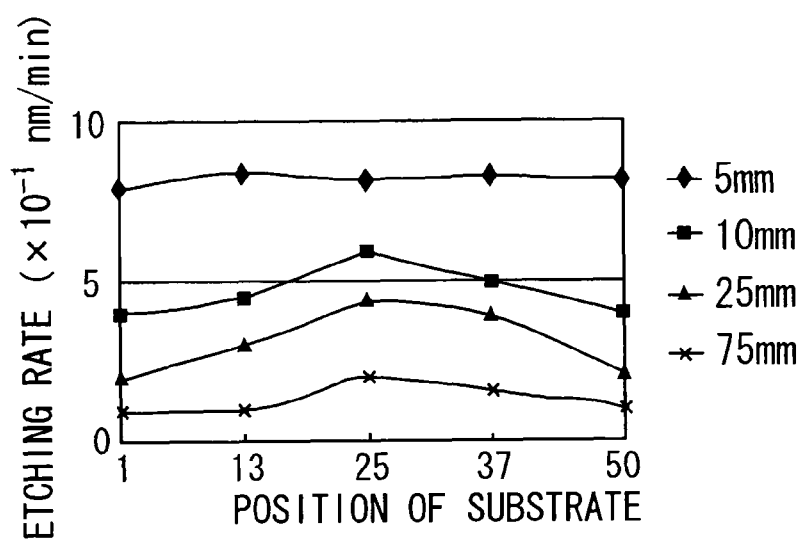
FIG. 16 is a graph showing the relationship between the position of the substrate and the etching rate.
Figure 18:
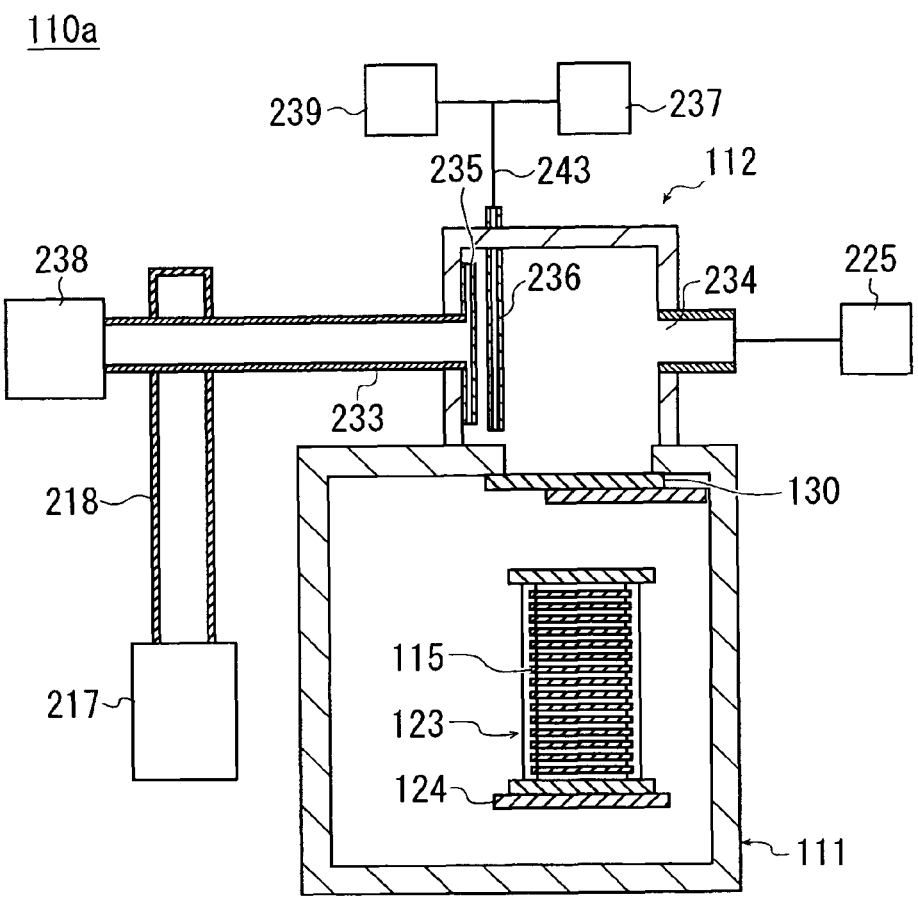
FIG. 18 is a diagram showing one example of a reaction apparatus that can be used for the present invention.

FIG. 15 shows the state in which a substrate 115 of diameter d is carried into the reaction space 138 of diameter D, and the center 118 of the substrate 115 is positioned on the central axis 120, and the substrate is disposed horizontally. In this state, the distance between the outer periphery of the substrate 115 and the wall face 137 is a constant small interval w.

Also, the center of the boat 123 is substantially the same as the center of the substrate 115, and the radius from the center of the boat 123 to the outer periphery of the columns 121 is smaller than the radius D/2 of the reaction space 138. The support columns 121 extend substantially in the vertical direction, and when the center of the substrate 115 and the center of the boat 123 are positioned on the central axis 120 of the reaction space 138, the support columns 121 do not contact with the wall face 137.

A motor, not shown in the diagram, is connected to the boat 123, and the boat 123 can rotate horizontally around the central axis 120 of the reaction space 138. As the boat 123 rotates, the substrate 115 loaded on the boat 123 rotates in a horizontal plane around the center of the substrate 115.

As described above, the distance (radius) from the central axis 120 to the outer periphery of the columns 121 is smaller than the radius D/2 of the reaction space 138. Therefore, the columns 121 do not contact with the wall face 137 even when the boat 123 rotates. Also, when the boat 123 rotates horizontally, the seal plate 124 does not rotate, and the closed state is maintained.

In the interior of the reaction chamber 132, a shower nozzle shaped radical introduction apparatus 136 and a reactive gas introduction apparatus 135 are respectively vertically extended in a position outside of the rotating columns 121.

This apparatus 105 has two reactive gas introduction apparatuses 135, and they are disposed on the right and left sides of the radical introduction apparatus 136.

A reactive gas supply source 147, a micro wave source 149 and an active gas supply source 148 are disposed outside the reaction chamber 112.

The active gas supply source 148 is connected to the radical introduction apparatus 136 via an introduction pipe 133. The microwave source 149 is connected to a wave guide pipe 139. One part of the introduction pipe 133 is constructed from quartz, and this part constructed from quartz passes through the wave guide pipe 139. Once the microwave source 149 is activated, the microwaves generated travel inside the wave guide pipe 139 and pass through the quartz part of the introduction pipe 133. The reactive gas apparatus 135 is connected to the reactive gas supply source 147.

A plurality of small holes are formed in the reactive gas introduction apparatus 135 and the radical introduction apparatus 136 at constant intervals, and when reactive gas is supplied first to the reactive gas introduction apparatus 135 while horizontally rotating the substrate 115, the reactive gas is introduced into the reaction space 138 through the small holes of the reactive gas introduction apparatus 135.

The small holes of the reactive gas introduction apparatus 135 and the small holes of the radical introduction apparatus 136 are positioned between the adjacent substrates 115. Furthermore, the substrates 115 loaded on the boat 123 are disposed at even intervals, and the small holes of the reactive gas introduction apparatus 135 and the small holes of the radical introduction apparatus 136 are also disposed at even intervals. When the substrate 115 is an 8 inch wafer of 200 mm diameter, the pitch of the substrates 115 is 6.35 mm, and the interval between the substrates 115 is 5.58 mm. When the substrate 115 is a 12 inch wafer of 300 mm diameter, the pitch of the substrates 115 is 10 mm, and the gap between the substrates 115 is of the order of 9.2 mm.

Moreover, the small holes (0.6 mm) of the reactive gas introduction apparatus 135 and the small holes (3 mm) of the radical introduction apparatus 136 are smaller than the interval between the substrates 115. Therefore, the gas introduced through these small holes flows to in between the adjacent substrates 115.

The small holes of the reactive gas introduction apparatus 135 and the radical introduction apparatus 136 face the direction of the center of the substrates 115, and an exhaust port of an evacuation system 134, formed on the wall face 137, is disposed on the opposite side of the radical introduction apparatus 136 taking the central axis 120 as the center. Moreover, as will be described later, when the interval w between the substrates 115 and the wall face 137 is small, the reactive gas introduced through the small holes into the reaction space 138 flows towards the center of the substrate 115 and is exhausted from the exhaust port.

A thin film of the etching object is formed on the surface of each substrate 15. Moreover, since the substrate 115 is rotating horizontally, the thin film on the surface of the substrate 115 comes in contact with the reactive gas from the central position of the substrate to the peripheral position of the substrate. The reactive gas flows for a certain period of time while the substrate 115 rotates so that the reactive gas is adsorbed uniformly onto the surface of the thin film of each substrate 115.

Next, active gas is flowed from the active gas supply source 148 into the introduction pipe 133, and the microwave source 149 is activated. As a result, microwaves are irradiated to the active gas at the quartz part where the introduction pipe 133 passes through the wave guide pipe 139, and plasma of the active gas is produced. The radicals of the constituent atoms of the active gas are contained in the plasma of the active gas. The radicals produced flow inside the introduction pipe 133 towards the reaction chamber 112 and reach the radical introduction apparatus 136, and are introduced into the reaction space 138 through the small holes of the radical introduction apparatus 136 and flow towards the direction of the center of each substrate 115.

At this time, since the substrate 115 is rotating in a horizontal plane, the thin film on the surface of the each substrate 115 is contacted with the radicals, from the central position of the substrate to the peripheral position of the substrate. Also, when an auxiliary gas with a greater flow rate than that of the active gas, is added to the active gas, the radicals are flowed along with the auxiliary gas that flows towards the center of the substrate 115. When the active gas is introduced along with the introduction of the radicals, the radicals flow towards the center of the substrate 115 together with the active gas, and uniformly contact with the surface of the substrate 115.

When the surface of the thin film of the each substrate 115 comes in contact with the radicals, the reactive gas that has been adsorbed onto the thin film, the radicals, and the etching object all react and a reaction product is formed.

For example, when the substrate is a silicon wafer and the silicon oxide formed on the substrate is the etching object, if $NF_3$ gas is used for the reactive gas, and either one of $NH_3$ gas or $H_2$ gas or both are used as the active gas, then the reaction expressed by the formula (1) mentioned above progresses at normal temperature, and an intermediate product $NH_xF_y$ is produced.

The intermediate product $NH_xF_y$ reacts with the silicon oxide at normal temperature as expressed by the formula (2), and a reaction product consisting of (NH4)2SiF6 is produced.

After the reaction product has been sufficiently produced by the reaction described above, the supply of active gas, reactive gas, and microwaves is stopped and the pressure of the reaction space 138 is lowered.

One or a plurality of infrared lamps 151 is disposed around the reaction space 138. Each infrared lamp 151 is switched on while rotating the boat 123, and while rotating each substrate 115, infrared rays are irradiated to the surface thereof, and the reaction product is heated and thermally decomposed, and gas is produced.

In this case, since the temperature of the substrate 115 has been raised, the produced gas is easily desorbed from the substrate 115 and evacuated by the evacuation system 134. As a result, the reaction product is removed from the substrate 115, and the etching object is removed.

When the reaction product is $(NH_4)_2SiF_6$, if the temperature rises to 100° C. or higher, the chemical reaction expressed by the formula (3) described above progresses, and the $NH_3$ gas, HF gas and $SiF_4$ gas produced are desorbed from the substrate surface, and the silicon oxide thin film is removed from the surface of the substrate 115 by evacuation. In the case of removing the gases produced by thermal decomposition, by flowing a large amount of inert gas such as $N_2$ gas and Ar gas, the pyrolysis gas can be removed by the flow of the inert gas.

After thermal decomposition of the reaction product, and pyrolysis gas removal are complete, the boat 123 is lowered and carried into the transfer chamber 111, and then the transfer robot 142 transfers it to the cassette 141 completing one batch processing of the etching operation.

Hereafter, a working example of the etching apparatus according to the present invention is described in detail along with comparative examples.

Working Example

Using an 8 inch (20.32 cm) silicon wafer substrate 115 upon which a silicon oxide thin film of predetermined film thickness is formed, the silicon oxide film was etched in reaction chambers 112 of different diameters. Fifty pieces of this substrate 115 were loaded on one boat 123. Then, the film thickness of the silicon oxide thin film was measured before and after etching processing, and the etching rate of each substrate 115 was found from the film thickness before and after etching, and the etching time.

First of all, Table 1 shows the relationship between the interval w and etching rate.

TABLE 1

| Position of | Etching rate ($\times 10^{-1}$ nm/minute) | | | |
| | Intervals | | | |
| Substrate | 5 mm | 10 mm | 25 mm | 75 mm |
| --- | --- | --- | --- | --- |
| 1 | 8.0 | 4.0 | 2.0 | 1.0 |
| 13 | 8.5 | 4.5 | 3.0 | 1.0 |
| 25 | 8.2 | 6.0 | 4.5 | 2.0 |
| 37 | 8.4 | 5.0 | 4.0 | 1.5 |
| 50 | 8.2 | 4.0 | 2.0 | 1.0 |

"Position of Substrate" in the table describes the vertical position of the substrates 115 loaded on the boat 123, and ascending numbers have been assigned to the 50 substrates 115 from the bottom to the top. The one whose position of substrate is "1" is at the bottom, and the one whose position is "50" is at the top. A dummy wafer was disposed above the topmost substrate 115, and as a result, etching conditions for the topmost substrate 115 and for substrates 15 at other positions were the same.

Table 1 shows that the etching rate becomes greater as the interval w becomes smaller. An interval w greater than 75 mm leads to a too slow etching rate, and the interval w is preferably no greater than 25 mm Next, film thickness measurements for one substrate 15 were performed at several positions, and the substrate in-plane uniformity of etching amount was found from the etching amount at each position. Table 2 shows the relationship between uniformity and the interval w.

TABLE 2

| Position of | In-plane uniformity (± %) | | | |
| | Intervals | | | |
| Substrate | 5 mm | 10 mm | 25 mm | 75 mm |
| --- | --- | --- | --- | --- |
| 1 | 4.0 | 13 | 22 | 58 |
| 13 | 3.8 | 12 | 18 | 49 |
| 25 | 3.0 | 10 | 13 | 47 |
| 37 | 3.5 | 12 | 15 | 48 |
| 50 | 3.0 | 14 | 19 | 50 |

The values of Table 2 are values in which the standard deviation of the etching amount within one substrate 115 is divided by the average value of the etching amount of the substrate 115, and smaller values signify higher uniformity of etching amount. The uniformity becomes higher as the interval w becomes smaller, and especially the difference between the uniformity for 25 mm and for 75 mm is large. Table 2 also shows that the gap w is preferably no greater than 25 mm.

Another embodiment of an etching method according to the present invention is described below. In the following description, parts having the same construction as for the etching apparatus 105 shown in FIG. 11 to FIG. 17 are given the same reference symbols as those of FIG. 11 to FIG. 17 and descriptions thereof is omitted.

An etching apparatus to which the present embodiment is applicable also has a reaction apparatus 110a, a transfer robot, a stacker, and a work bench as well as the etching apparatus 105 shown in FIG. 11, and furthermore the reaction apparatus 110a has a transfer chamber 111 and a reaction chamber 112.

A vacuum pump 225, a reactive gas supply system 237, a radical production gas supply system 238, a microwave source 217, and a purge gas supply system 239 are disposed outside the reaction chamber 112.

The radical production gas supply system 238 is connected to a first pipe 235 via an introduction pipe 233. Moreover, the reactive gas supply system 237 and the purge gas supply system 239 are connected to a second pipe 236 via a gas pipe 243.

The radical production gas supply system 238 has a gas container filled with $NH_3$ gas, which is the radical production gas, and a gas container filled with $N_2$ gas, which is the carrier gas. When the valve of each gas container is opened, the radical production gas and the carrier gas are introduced from the exhaust port of the first pipe 235 into the reaction chamber 12.

Moreover, the reactive gas supply system 237 has a gas container filled with $NH_3$ gas, which is the reactive gas, and the purge gas supply system 39 has a gas container filled with $N_2$ gas, which is the purge gas. When the valves of the gas containers are opened, either one of the reactive gas or the purge gas or both are introduced from the exhaust nozzle of the second pipe 236 into the reaction chamber 112.

Exhaust ports 234 are provided on either side of the central axis of the reaction chamber 112, on the inner wall face on the opposite side of the first and second pipes 235 and 236. The exhaust ports 234 are connected to the vacuum pump 225, and when the vacuum pump 225 is activated, the gas introduced into the reaction chamber 212 flows inside the reaction chamber 212 and is exhausted from the exhaust ports 234.

A wave guide pipe 218 is connected to the microwave source 217, and a radical introduction pipe 233 passes through a part of the wave guide pipe 18. A part of the radical introduction pipe 233 that passes through the wave guide pipe 218 is constructed from quartz, and when the microwave source 217 generates microwaves, the microwaves traveling through the wave guide pipe 218 and enter into the radical introduction pipe 233 from this passing through part. If radical production gas is flowed from the radical production gas supply system 238 in this state, microwaves are irradiated to the radical production gas at the passing through part and the gas becomes plasma, and radicals are produced.

The radicals produced flow inside the radical introduction pipe 233 along with radical production gas not yet processed, carrier gas, and by-products of the change into plasma, and are introduced into the reaction chamber 112 from the exhaust nozzles of the first pipe 235. Since the exhaust nozzles of the first pipe 235 and the position where the radical introduction pipe 233 passes through the wave guide pipe 218 are distanced from each other, the plasma produced at the part where the radical introduction pipe 233 passes through the wave guide pipe 218 does not enter into the reaction chamber 112.

Figure 19:
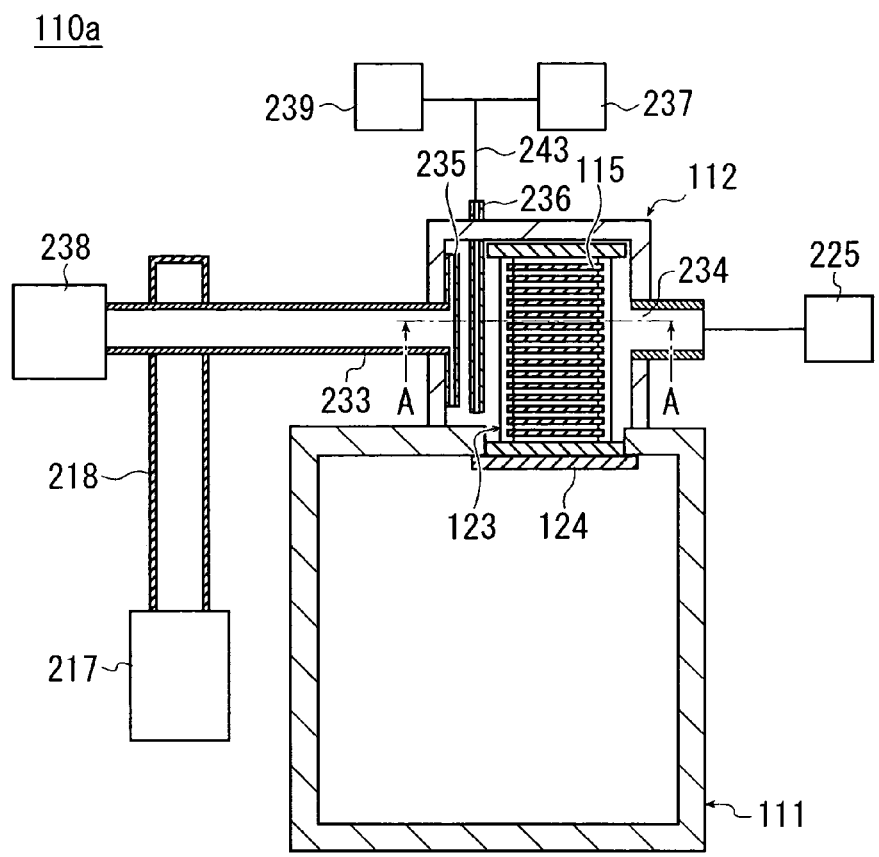
FIG. 19 is a diagram showing a state in which a boat of the reaction apparatus shown in FIG. 18 is carried into a reaction chamber loaded with substrates.

Next, the process of etching the etching object using this etching apparatus will be described. First of all, the inside of the reaction chamber 112 and the inside of the transfer chamber 111 are evacuated with each of the valves of the gas supply systems 237 to 239, the transfer port 114, and the valve 130, closed. Then, after vacuum atmospheres of predetermined pressures have been respectively formed, the valve 130 is opened and the boat 123 having a plurality of circular shaped substrates 115 not yet processed loaded thereon is carried into the reaction chamber 112. Each substrate 115 is horizontally disposed, and the boat 123 is stopped so that the exhaust nozzles of the second pipe 236 are respectively positioned between the substrates 115 (FIG. 19).

Next, with the valve of the radical production gas supply system 238 and the valve of the purge gas supply system 239 respectively closed, the valve of the reactive gas supply system 237 is opened and reactive gas is introduced from the exhaust nozzles 229.

Figure 21:
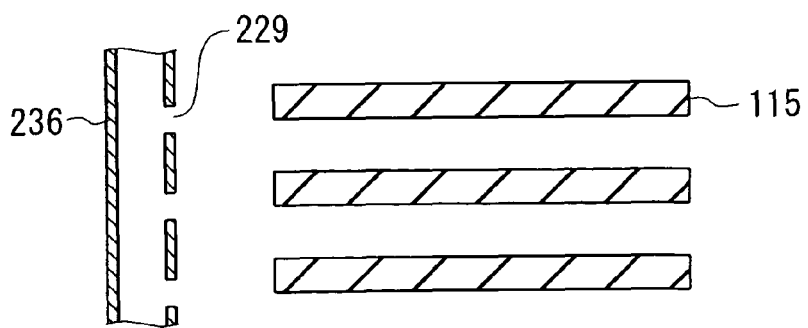
FIG. 21 is a diagram for explaining the relative positions of an exhaust port and the substrate.

FIG. 21 is a diagram showing the positions of the substrates 115 carried into the reaction chamber 112, and the exhaust nozzles 229 of the second pipe 236. The substrates 115 are loaded on the boat 123 at even intervals, and the exhaust nozzles 229 of the second pipe 236 are also disposed at even intervals. For example, when the substrate 115 is an 8 inch wafer of 200 mm diameter, the pitch of the substrates is 6.35 mm, and the interval between the substrates is 5.58 mm. Moreover, when the substrate 115 is a 12 inch wafer of 300 mm diameter, the pitch of the substrates is 10 mm, and the interval between the substrates 115 is of the order of 9.2 mm.

The diameter of the exhaust nozzles 229 of the second pipe 236 is of the order of 0.5 mm and is smaller than the interval between the substrates 215. Moreover, each exhaust nozzle 229 faces the central axis of the substrates 215. Therefore, the reactive gas introduced from the exhaust nozzles 229 flows between the substrates 215 passing through the center of the substrates and is exhausted from the exhaust port 234.

In this case, the pressure inside the reaction chamber 112 gradually increases as reactive gas flow rate gradually increases while exhausting is continued at a predetermined exhaust speed. When the pressure in the reaction chamber 112 reaches the pressure range of $6.67 \times 10$ Pa (0.5 Torr) or higher, the reactive gas flow rate is made constant and the exhaust valve of the vacuum pump 225 is adjusted to maintain the pressure in the reaction chamber 112 at a predetermined pressure (3 Torr, for example).

At this time, the radicals have not yet been introduced into the reaction chamber 112, and since the reactive gas alone does not react with the etching object, the reactive gas is adsorbed onto the surface of the substrate 115 without reacting with the etching object. Once the pressure inside the reaction chamber has reached the pressure range of $6.67 \times 10$ Pa or higher, if the pressure is maintained within this pressure range during a predetermined adsorption time, a sufficient amount of reactive gas is adsorbed onto the surface of all the substrates 115.

The substrates 115 are kept rotating around the central axis of the boat 123 by the rotation mechanism, not shown in the diagram, until the adsorption time has elapsed, and the surfaces of the substrates 115 are uniformly exposed to the reactive gas by this rotation. As a result, the reactive gas is uniformly adsorbed onto the surface of the individual substrates 115.

After the adsorption time has elapsed, reactive gas introduction and rotation of the substrates 115 are continued with the valve of the purge gas supply system 239 closed, while the valve of the radical production gas supply system 238 is opened and radical production gas along with carrier gas are introduced into the reaction chamber 112.

Furthermore, the flow rates of the radical production gas and carrier gas are gradually increased up to a predetermined flow rate, and the opening of the exhaust valve is increased, to thereby maintain the pressure in the reaction chamber 112 within in the pressure range of 6.67×10 Pa or higher.

When the microwave source 17 is activated while the flow rate of each gas is maintained at a predetermined value, (for example $NF_3$ gas flow rate is 4000 sccm, $NH_3$ gas flow rate is 1300 sccm, and $N_2$ gas flow rate is 3900 sccm), and the pressure in the reaction chamber 12 is maintained at a predetermined pressure, radical production gas changes into plasma, and hydrogen gas radicals (H*) are produced. These radicals are introduced from the first pipe 235 into the reaction chamber 112 along with; radical production gas that has not been reacted, the by-products of plasma generation, and carrier gas.

Figure 20:
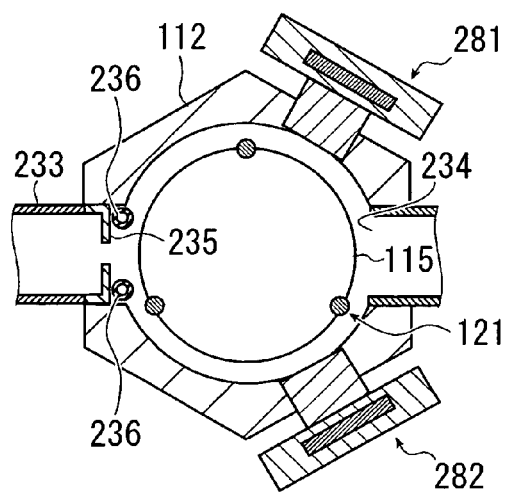
FIG. 20 is a transverse sectional view of the reaction chamber of the reaction apparatus shown in FIG. 18.

Here, as shown in FIG. 20 described hereafter, two second pipes 236 are disposed on both sides of the first pipe 235. Each exhaust nozzle of the first pipe 235 faces the center of the substrate 115 in the same way as the exhaust nozzles of the second pipes 236 so that radicals introduced from the first pipe 235 flow between the adjacent substrates 115 through the center of the substrates 115 in the flow of reactive gas along with; carrier gas, radical production gas that has not been reacted, and the by-products of plasma generation, and then the radicals are exhausted from the exhaust pipe 234.

At this time, since the substrates 115 are rotating along with the boat 123 around the central axis of the substrates 115, the surfaces of the substrates 115 are uniformly exposed to the radical production gas due to the rotation. The substrates 115 are formed from a silicon substrate, and the etching object formed from a silicon oxide film is respectively formed on the surfaces of the substrates 115. Therefore, when the surfaces of the substrates 115 are exposed to the radicals, the etching gas adsorbed beforehand on the surfaces of the substrates 115 reacts with the radicals to produce an intermediate product, and the intermediate product further reacts with the etching object, to produce a reaction product.

Then, the opening of the vacuum pump 255 is adjusted, and while maintaining the pressure in the reaction chamber 112 at a constant pressure of 6.67×10 Pa or higher, the reaction of radicals, reactive gas and the etching object is progressed.

After activating the microwave source 217, production of the radicals, and introduction of the etching gas, the radical production gas, and the carrier gas are continued for a predetermined reaction time. Then, when the reaction of the etching object has progressed sufficiently, the microwave source 217 is stopped and the valve of the reactive gas supply system 237 and the valve of the radical production gas supply system 238 are closed, and the introduction of the reactive gas, the radical production gas, and the carrier gas is stopped.

When evacuation is continued with the introduction of each gas stopped, and the pressure in the reaction chamber 112 is lowered to a predetermined pressure (0.003 Torr here), the radicals and the reactive gas are exhausted from the reaction chamber 122 along with; the radical production gas that has not been reacted, the by-products of plasma generation, and the carrier gas (gas removal process).

After the pressure inside the reaction chamber 112 has been lowered to a predetermined pressure and the pressure has been maintained for a predetermined time, evacuation is continued while the purge gas is introduced into the reaction chamber 112 at a predetermined flow rate, (500 sccm here), in order to raise the pressure in the reaction chamber 112 to a predetermined pressure (5 Torr here), higher than the pressure at the time of the gas removal process.

As described above, the purge gas is introduced from the exhaust nozzle 229 of the same pipe 236 from which the reactive gas is introduced. Therefore, the purge gas flows between adjacent substrates 115 through the center of the substrates 115 in the same way as the reactive gas.

Moreover, since the intervals of the adjacent substrates 115 are narrow, the flow resistance of the space between the substrates 115 is greater than the flow resistance of the space between the periphery of the substrates 115 and the inner wall of reaction chamber 112. Therefore, the purge gas flows not only between the substrates 115 but also into the space between the periphery of the substrates 115 and the inner wall of the reaction chamber 112.

Thus, since the purge gas is exhausted from the exhaust port 234 after being flowed not only between the adjoining substrates 115 but also through the space between periphery of the substrates 115 and the inner wall of the reaction chamber 112, even if some reactive gas remains in the reaction chamber 112, the reactive gas is swept away and is removed from the exhaust port 234 along with the purge gas.

FIG. 20 is a sectional view along the line A-A in FIG. 19. One or more heaters 281 and 282 are installed in the sidewall of the reaction chamber 112, and when in a state with purge gas introduced, the heaters 281 and 282 are switched on and emit infrared rays towards the substrates 115, the temperature of the substrates 115 rises.

When the amount of electricity supplied to the heaters 281 and 282 is adjusted and the temperature of each substrate 115 is maintained at a predetermined temperature of 100° C. or higher (130° C. here), the reaction product formed on the surface of the substrate 115 is thermally decomposed and pyrolysis gas such as HF and $SiF_4$ are discharged.

While the pyrolysis gas is being discharged from the substrate 115, purge gas is introduced into the reaction chamber 112, and the pyrolysis gas is swept away by the purge gas flowing between the substrates 115 through the center of the substrates 115, and is exhausted from the exhaust port 234 along with the purge gas. At this time, the pyrolysis gas is exhausted more efficiently if each substrate 115 is rotated in a horizontal plane around its central axis.

Thus, since the pyrolysis gas is efficiently exhausted from the reaction chamber 112 by the purge gas, the amount of the pyrolysis gas that reaches the inner wall of the reaction chamber 112 is small. Therefore, even if a process film formed of a substance that is highly reactive with pyrolysis gas such as aluminum oxide ($Al_2O_3$) is formed on the inner wall of the reaction chamber 112, particles are not easily produced.

Moreover, since the purge gas also flows between the periphery of the substrate 115 and the inner wall of the reaction chamber 112, the pyrolysis gas flowing towards the inner wall of the reaction chamber 112 is swept away by the purge gas and is exhausted. Also, even if particles are formed as a result of the reaction of pyrolysis gas and the process film, the particles are washed away by the purge gas and are exhausted from the exhaust port 234 along with the purge gas. Thus, with the etching method of the present invention, not only are particles not easily produced, but they are also removed in the etching heating process even in the case where they are produced.

When a predetermined time (300 seconds here) has lapsed since commencing heating, and the reaction product has been sufficiently decomposed and removed, if evacuation is continued while the electricity supply to the heaters 281 and 282, and purge gas introduction are stopped, the purge gas is exhausted from the reaction chamber 112 along with the pyrolysis gas and the particles, and the pressure inside the reaction chamber 112 decreases.

After purge gas introduction is stopped, evacuation is continued for a predetermined time, and when the pressure in the reaction chamber 112 has decreased to a predetermined pressure (0.003 Torr here), the seal plate 124 is lowered and the boat 123 is carried into the transfer chamber 111, in which a vacuum atmosphere has been established beforehand.

After the valve 130 between the transfer chamber 111 and the reaction chamber 112 is closed and the transfer chamber 111 is isolated from the reaction chamber 112, inert gas is introduced into the transfer chamber 111 while evacuation is continued. When the flow rate is increased up to a predetermined flow rate (200 slm here), taking a predetermined amount of time (200 seconds here), the pressure in the transfer chamber 111 gradually increases.

When the inert gas reaches a predetermined pressure, the flow rate is maintained for a predetermined time (100 secs here), and once the substrate 115 is sufficiently cooled down and the transfer port 114 is opened, the etched substrate can be taken out.

The case of introducing purge gas from the pipe 236 that the reactive gas is introduced from has been described above, however the present invention is not limited to this. As long as the exhaust nozzle for purge gas introduction is positioned between the substrates, the purge gas may be introduced from the pipe 235 from which the radicals are introduced, or another pipe may be provided in the reaction chamber 112 and the purge gas may be introduced from that pipe.

Heating of the substrate 115 may be commenced when purge gas introduction commences as long as it is done while purge gas is being introduced into the reaction chamber 112. Also, heating may be commenced after a predetermined time has lapsed from commencement of purge gas introduction and the pressure inside the reaction chamber 112 has risen to a predetermined pressure.

The type of gas to be used as purge gas is not particularly limited, and in addition to nitrogen gas, various types of gas such as argon gas (Ar) and xenon gas (Xe) may be used as long as their reactivity with respect to, the construction materials of the vacuum tank, the process film of the vacuum tank inner wall, and the substrate is low. Moreover, while one type of gas may be used alone for the purge gas, a mixed gas of two types of gas may also be used When the silicon oxide film is etched, fluorine gas can be used as the reactive gas. Preferably, the fluorine gas used should be of a chemical structure that does not contain carbon and oxygen. For example, nitrogen fluorine gas such as $NF_3$ may be used. Moreover, while one type of gas may be used alone for the reactive gas, a mixed gas of two or more types of reactive gas may also be used.

Moreover, a carrier gas such as argon gas or nitrogen gas can be supplied into the reaction chamber 112 along with the reactive gas. The production method of the radicals is not particularly limited, and for example, light such as visible light or ultraviolet light may be irradiated to the radical formation gas, to form the radicals.

The type of gas used for the radical production gas is not limited to ammonia gas, and needs only be able to produce radicals, and hydrogen gas can be used for example. While one type of radical production gas may be used alone, two or more gases may also be mixed and used.

The case of introducing radicals after the reactive gas has been introduced has been described above. However, the present invention is not limited to this, and radical introduction and reactive gas introduction may be commenced at the same time, and also radicals may be introduced before the reactive gas is introduced.

What is claimed is:

1. An etching apparatus comprising:
    a vacuum processing tank;
    a first processing gas introduction section that is constructed such that a first processing gas in a radical state is introduced into said vacuum processing tank along a first direction and is guided to a processing object; and
    a second processing gas introduction section that is constructed such that a second processing gas that reacts with said first processing gas is introduced into said vacuum processing tank and is guided to said processing object,
    wherein said first processing gas introduction section has a first nozzle section,
    wherein said second processing gas introduction section has two second nozzle sections, said first nozzle section being located between said two second nozzle sections,
    wherein both said first nozzle section and said two second nozzle sections are disposed at one side of said vacuum processing tank and aimed generally towards an exhaust section,
    wherein, when viewed from above said tank, said first nozzle section and said two second nozzle sections are substantially in a line along said one side of said tank,
    wherein said second processing gas from said two second nozzle sections is introduced so that said second processing gas substantially surrounds said first processing gas and gradually approaches said first processing gas, and
    wherein said second processing gas from one of said two second nozzle sections is introduced along a second direction and toward a predetermined point, a first substantially acute angle being made by said first direction and said second direction,
    wherein said second processing gas from the other one of said two second nozzle sections is introduced along a third direction and toward said predetermined point, a second substantially acute angle being made of said first direction and said third direction on the opposite side of said first substantially acute angle with respect to said first direction,
    wherein said second direction and said third direction substantially form an acute angle therebetween,
    wherein a distance between said two second nozzle sections is smaller than a distance between said predetermined point and each of said two second nozzle sections, and
    wherein said second processing gas from said two second nozzle sections acts as gas curtain with respect to said first processing gas.

2. The etching apparatus according to claim 1, wherein said second nozzle sections are provided at positions that are symmetric with said first direction of said first nozzle section.

3. The etching apparatus according to claim 1, wherein said first and second gas introduction sections are constructed such that said processing gas is guided to a center part of said processing object.

4. The etching apparatus according to claim 1, wherein said first and second nozzle sections of said first and the second gas introduction sections have a plurality of introduction ports for introducing said processing gas to in between a plurality of processing objects disposed at predetermined intervals.

5. The etching apparatus according to claim 1, wherein said first acute angle has the substantially same angle measure as said second acute angle.

6. The etching apparatus according to claim 1,
    wherein said vacuum processing tank has a substantially polygonal contour, and wherein, when viewed from above the tank, said first nozzle section and said plurality of second nozzle sections are substantially in a line along one side of said substantially polygonal contour.

7. An etching apparatus comprising:
a first processing gas introduction section that is constructed such that a first processing gas in a radical state is introduced into a vacuum processing tank and is guided to a plurality of processing objects; and
a second processing gas introduction section that is constructed such that a second processing gas that reacts with said first processing gas is introduced into said vacuum processing tank and is guided to said plurality of processing objects,
wherein said first processing gas introduction section has a first nozzle section,
wherein said second processing gas introduction section has two second nozzle sections, said first nozzle section being located between said two second nozzle sections
wherein said vacuum processing tank has a substantially polygonal hexagonal contour,
wherein said first and second nozzle sections of said first and second processing gas introduction sections have a plurality of introduction ports provided in positions between each of said plurality of processing objects for introducing said processing gas between each of said plurality of processing objects disposed at predetermined intervals,
wherein, when viewed from above the tank, said first nozzle section and said two second nozzle sections are substantially in a line along one side of said substantially hexagonal contour,
wherein said second processing gas from said two second nozzle sections is introduced so that said second processing gas substantially surrounds said first processing gas and that gradually approaches said first processing gas in said first direction wherein said two second nozzle sections are disposed adjacent to each other so that said second processing gas from said plurality of nozzle sections acts as gas curtain with respect to said first processing gas,
wherein each flow directions of said second processing gas from said two second nozzle sections is substantially directed to an central axis of said vacuum processing tank, and
wherein two flow directions of said second processing gas from said two second nozzle sections substantially form an acute angle therebetween.

8. The etching apparatus according to claim 7, wherein the construction is such that said processing objects rotate inside said vacuum processing tank, and said first processing gas introduction section and said second processing gas introduction section have nozzle sections constructed such that said processing gas passes through the central axis of rotation of said processing objects.

9. The etching apparatus according to claim 7, wherein said second nozzle sections are provided at positions that are symmetric with said first direction.

10. The etching apparatus according to claim 7,
wherein said plurality of second nozzle sections include two nozzle sections, said first nozzle section being located between said two nozzle sections,
wherein said second processing gas from one of said two nozzle sections is introduced along a second direction, a first substantially acute angle being made by said first direction and said second direction, and
wherein said second processing gas from the other one of said two nozzle sections is introduced along a third direction, a second substantially acute angle being made of said first direction and said third direction on the opposite side of said first substantially acute angle with respect to said first direction.

11. The etching apparatus according to claim 10, wherein said first acute angle has the substantially same angle measure as said second acute angle.

12. An etching apparatus comprising:
a vacuum processing tank;
a first processing gas introduction section that is constructed such that a first processing gas in a radical state is introduced into said vacuum processing tank along a first direction and is guided to a processing object, and
a second processing gas introduction section that is constructed such that a second processing gas that reacts with said first processing gas is introduced into said vacuum processing tank and is guided to said processing object,
wherein said first processing gas introduction section has a first nozzle section,
wherein said second processing gas introduction section has two second nozzle sections, said first nozzle section being located between said two second nozzle sections,
wherein both said first nozzle section and said two second nozzle sections are disposed at one side of said vacuum processing tank and aimed generally towards an exhaust section,
wherein, when viewed from above the tank, said first nozzle section and said two second nozzle sections are substantially in a line along said one side of said vacuum processing tank,
wherein said second processing gas from said two second nozzle sections is introduced so that said second processing gas substantially surrounds said first processing gas and gradually approaches said first processing gas,
wherein said second processing gas from one of said two second nozzle sections is introduced along a second direction and toward an central axis of said vacuum processing tank, a first substantially acute angle being made by said first direction and said second direction,
wherein said second processing gas from the other one of said two second nozzle sections is introduced along a third direction and toward the central axis of said vacuum processing tank, a second substantially acute angle being made of said first direction and said third direction on the opposite side of said first substantially acute angle with respect to said first direction,
wherein said second direction and said third direction substantially form an acute angle therebetween,
wherein said two second nozzle sections are disposed with the same first distances from said central axis of said vacuum processing tank, and
wherein a second distance between said two second nozzle sections is smaller than the first distance.

* * * * *